(12) United States Patent
Emura et al.

(10) Patent No.: US 10,468,556 B2
(45) Date of Patent: Nov. 5, 2019

(54) LIGHT EMITTING ELEMENT AND LIGHT EMITTING DEVICE

(71) Applicant: Nichia Corporation, Anan-shi, Tokushima (JP)

(72) Inventors: Keiji Emura, Anan (JP); Yoshiki Inoue, Anan (JP); Hiroaki Kageyama, Tokushima (JP)

(73) Assignee: NICHIA CORPORATION, Anan-Shi (JP)

(*) Notice: Subject to any disclaimer, the term of this patent is extended or adjusted under 35 U.S.C. 154(b) by 0 days.

(21) Appl. No.: 16/100,104

(22) Filed: Aug. 9, 2018

(65) Prior Publication Data
US 2018/0351043 A1 Dec. 6, 2018

Related U.S. Application Data

(63) Continuation of application No. 15/210,302, filed on Jul. 14, 2016, now Pat. No. 10,074,775.

(30) Foreign Application Priority Data

Jul. 16, 2015 (JP) .................................. 2015-142461
Jul. 7, 2016 (JP) .................................. 2016-135407

(51) Int. Cl.
H01L 33/38 (2010.01)
H01L 33/50 (2010.01)

(52) U.S. Cl.
CPC .......... H01L 33/382 (2013.01); H01L 33/387 (2013.01); H01L 33/504 (2013.01)

(58) Field of Classification Search
CPC ........................... H01L 33/382; H01L 33/504
See application file for complete search history.

(56) References Cited

U.S. PATENT DOCUMENTS

2011/0127549 A1  6/2011  Lee

FOREIGN PATENT DOCUMENTS

| JP | 2005-109113 A | 4/2005 |
| JP | 2010-508669 A | 3/2010 |
| JP | 2013-093584 A | 5/2013 |
| JP | 2013-098561 A | 5/2013 |
| WO | WO-2009/019836 A2 | 2/2009 |
| WO | WO-2010/146783 A1 | 12/2010 |

Primary Examiner — Elias Ullah
(74) Attorney, Agent, or Firm — Foley & Lardner LLP

(57) ABSTRACT

Provided are a light emitting element and a light emitting device with improved light emission intensity distribution. A light emitting element includes a light-transmissive substrate, an n-type semiconductor layer, a first p-type semiconductor layer, a first p-side electrode, a first n-side electrode, a second p-type semiconductor layer, a second p-side electrode, and a second n-side electrode. A light emitting device includes the light emitting element, and an external connection electrode provided at the light emitting element on a side opposite to the light-transmissive substrate. The external connection electrode includes an n-side external connection electrode connected to the first n-side electrode and the second n-side electrode, a first p-side external connection electrode connected to the first p-side electrode, and a second p-side external connection electrode connected to the second p-side electrode.

23 Claims, 17 Drawing Sheets

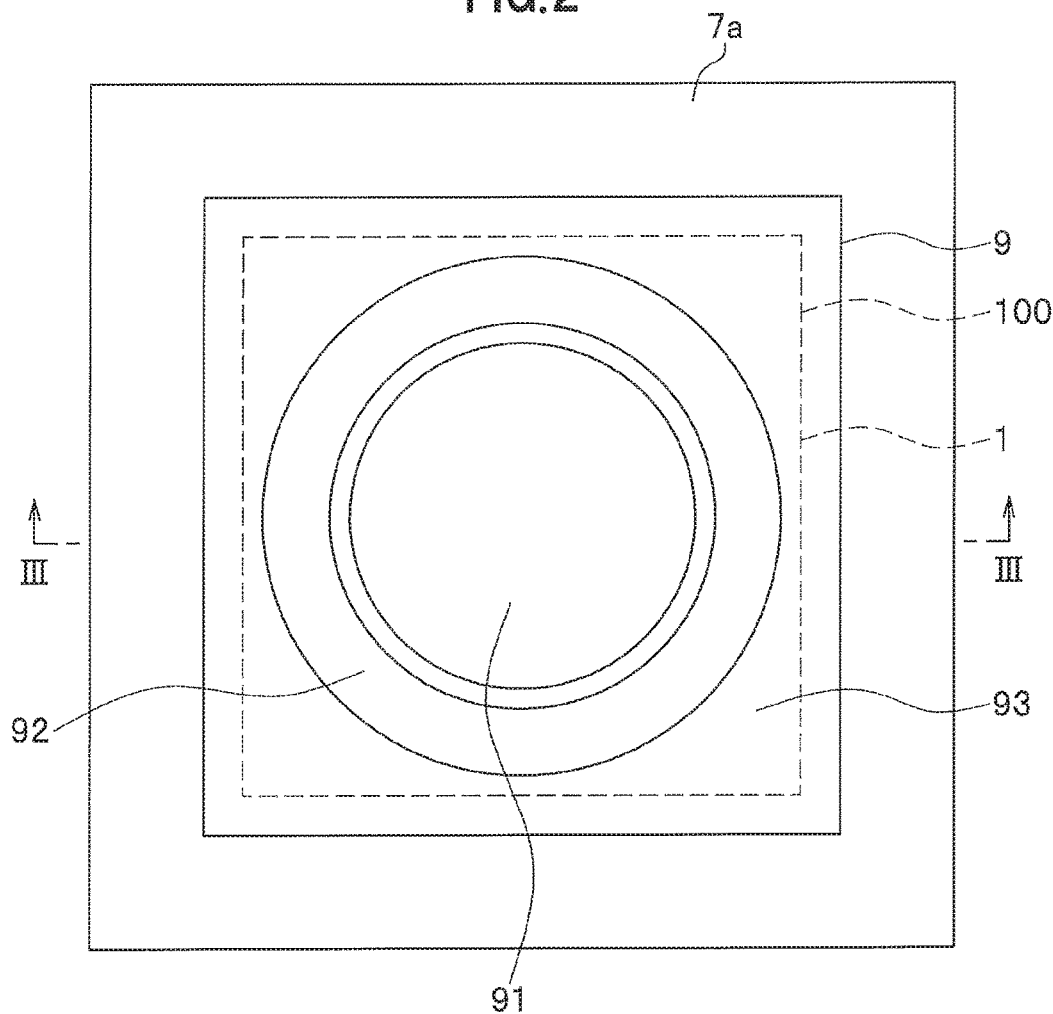
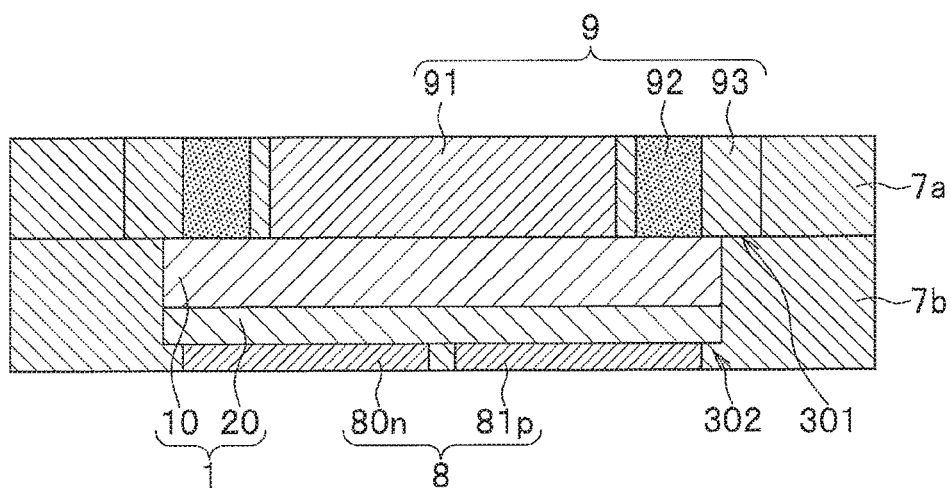

LIGHT EMITTING ELEMENT AND LIGHT EMITTING DEVICE

CROSS-REFERENCE TO RELATED APPLICATIONS

The present application is a continuation of U.S. patent application Ser. No. 15/210,302, filed Jul. 14, 2016, which claims priority under 35 U.S.C. § 119 to Japanese Patent Application No. 2015-142461, filed Jul. 16, 2015, and Japanese Patent Application No. 2016-135407, filed Jul. 7, 2016. The contents of these applications are incorporated herein by reference in their entireties.

BACKGROUND

1. Technical Field

The present disclosure relates to a light emitting element and a light emitting device.

2. Description of Related Art

In the field of light emitting elements used in light emitting devices, various development efforts have conventionally been made for achieving an even light emission intensity distribution in a light extraction surface. For example, a light emitting element used in a light emitting device disclosed in WO2009/019836 has at least two regions, namely, an edge portion and a region inner than the edge portion. The light emitting element is provided with an anode electrode at each of the edge portion and the region inner than the edge portion, and is further provided with a cathode electrode at the region inner than the edge portion, which cathode electrode is shared with the edge portion.

On the other hand, in a light emitting element, the current density is greater in a region where the distance between an anode electrode (a p-side electrode) and a cathode electrode (an n-side electrode) is short, which tends to result in uneven light emission. Accordingly, in view of unevenness in the current density attributed to disposition of the electrodes also, it is considered that the light emission intensity distribution is susceptible to improvement.

SUMMARY

An objective of embodiments of the present disclosure is to provide a light emitting element and a light emitting device with an improved light emission intensity distribution.

In order to achieve the objective stated above, a light emitting element according to the present disclosure includes: a light-transmissive substrate; a first semiconductor stacked-layer body having a first n-type semiconductor layer provided above part of the light-transmissive substrate, and a first p-type semiconductor layer provided above the first n-type semiconductor layer, the first p-type semiconductor layer being provided with a first hole; a first p-side electrode provided on the first p-type semiconductor layer; a first n-side electrode having a portion above the first p-side electrode, extending into the first hole, and being electrically connected to the first n-type semiconductor layer; a second semiconductor stacked-layer body having a second n-type semiconductor layer provided above the light-transmissive substrate and around the first semiconductor stacked-layer body in a plan view, and a second p-type semiconductor layer provided above the second n-type semiconductor layer, the second p-type semiconductor layer being provided with a second hole; a second p-side electrode provided on the second p-type semiconductor layer; and a second n-side electrode having a portion above the second p-side electrode, extending into the second hole, and being electrically connected to the second n-type semiconductor layer.

Further, in order to achieve the objective stated above, a light emitting element according to other embodiment of the present disclosure includes: a light-transmissive substrate; an n-type semiconductor layer provided above the light-transmissive substrate; a first p-type semiconductor layer provided above part of the n-type semiconductor layer and having a first hole; a first p-side electrode provided on the first p-type semiconductor layer; a first n-side electrode having a portion above the first p-side electrode, extending into the first hole, and being electrically connected to the n-type semiconductor layer; a second p-type semiconductor layer provided above the n-type semiconductor layer and around the first p-type semiconductor layer in a plan view, the second p-type semiconductor layer having a second hole; a second p-side electrode provided on the second p-type semiconductor layer; and a second n-side electrode having a portion above the second p-side electrode, extending into the second hole, and being electrically connected to the n-type semiconductor layer.

Still further, a light emitting device according to an embodiment of the present disclosure includes: the light emitting element; and an external connection electrode provided at the light emitting element on a side opposite to the light-transmissive substrate, wherein the external connection electrode includes: an n-side external connection electrode connected to the first n-side electrode and the second n-side electrode; a first p-side external connection electrode connected to the first p-side electrode; and a second p-side external connection electrode connected to the second p-side electrode.

Still further, a light emitting device according to other embodiment of the present disclosure includes: the light emitting element; and an external connection electrode provided at the light emitting element on a side opposite to the light-transmissive substrate, wherein the external connection electrode includes: a first n-side external connection electrode connected to the first n-side electrode; a second n-side external connection electrode connected to the second n-side electrode; and a p-side external connection electrode connected to the first p-side electrode and the second p-side electrode.

Still further, a light emitting device according to another embodiment of the present disclosure includes: the light emitting element; and an external connection electrode provided at the light emitting element on a side opposite to the light-transmissive substrate, wherein the external connection electrode includes: a first n-side external connection electrode connected to the first n-side electrode; a second n-side external connection electrode connected to the second n-side electrode; a first p-side external connection electrode connected to the first p-side electrode; and a second p-side external connection electrode connected to the second p-side electrode.

The light emitting element according to the embodiments of the present disclosure can reduce unevenness in the current density, and therefore can improve the light emission intensity distribution.

The light emitting device according to the embodiments of the present disclosure can reduce unevenness in the current density in the light emitting element, and therefore can improve the light emission intensity distribution.

BRIEF DESCRIPTION OF THE DRAWINGS

FIG. 2 is a plan view schematically showing a wavelength conversion member on the light emitting device according to the embodiment.

FIG. 3 is a cross-sectional view taken along line III-III in FIG. 2.

DETAILED DESCRIPTION OF EMBODIMENTS

Figure 1:
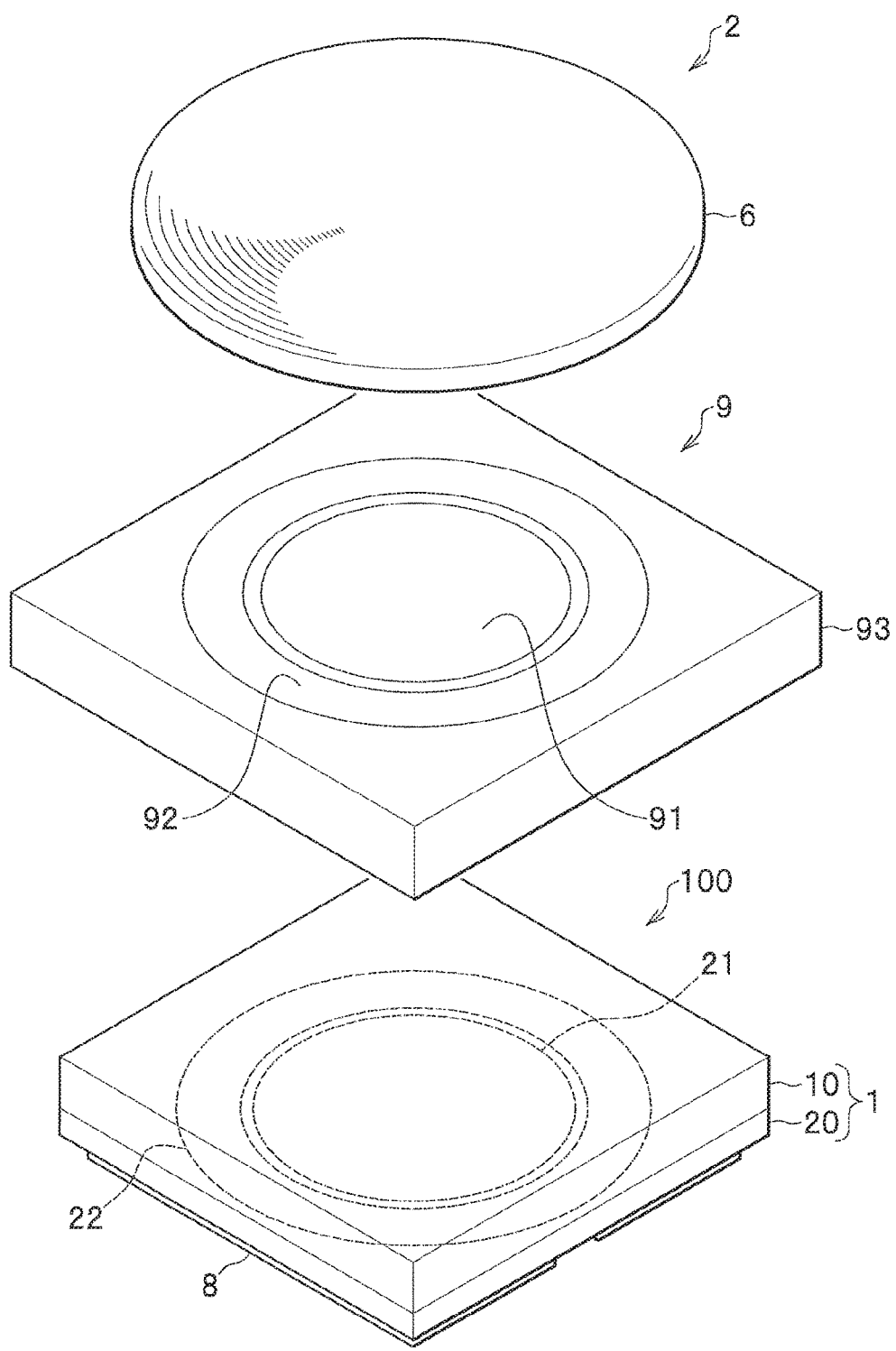
FIG. 1 is an exploded perspective view schematically showing a light emitting element, a light emitting device, and a light source according to an embodiment.

In the following, a description will be given of a light emitting element and a light emitting device according to embodiments of the present invention.

Note that, the drawings referred to in the following description schematically show the present invention, and therefore the scale, interval, or positional relationship of the constituent members may be exaggerated or the constituent members may be partially omitted. Further, plan views and cross-sectional views may not agree with each other in the scale, thickness, or interval. Still further, in the following description, like names and reference characters denote like or similar constituent members in principle, and the detailed description thereof will be omitted as appropriate.

First Embodiment

[Structure of Light Emitting Device]

Firstly, with reference to FIGS. 1 to 4, a description will be given of the structure of a light emitting element and a light emitting device according to a first embodiment of the present invention. A light source 2 shown in FIG. 1 includes a light emitting device 100, a wavelength conversion member 9 provided on a light-transmissive substrate 10 side of the light emitting device 100, and a Fresnel lens 6 provided opposite to the light-transmissive substrate 10 with reference to the wavelength conversion member 9. The light source 2 may be used as illumination, or may be installed in an external apparatus unit such as a flash module of a camera, for example. An exemplary external apparatus unit may be a camera-equipped mobile terminal such as a smartphone.

[Light Emitting Device]

The light emitting device 100 includes a light emitting element 1 and external connection electrodes 8. The light emitting device 100 is packaged having its periphery covered by a light reflecting member.

The light emitting element 1 may be, for example, a semiconductor light emitting element such as a light emitting diode chip. The upper surface of the light emitting element 1 is the light emitting surface, and the external connection electrodes 8 are provided at the lower surface of the light emitting element 1, i.e., on the side opposite to the light emitting surface. For example, the light emitting element 1 includes the light-transmissive substrate 10 positioned on the light emitting surface side and a semiconductor stacked-layer body 20 provided at the surface of the light-transmissive substrate 10 opposite to the light emitting surface, and the external connection electrodes 8 are formed on the surface of the semiconductor stacked-layer body 20. Note that, the description is given of the overview of the light emitting element 1 herein, and a detailed description thereof will be given later.

The semiconductor stacked-layer body 20 includes, for example in order from the light-transmissive substrate 10 side, an n-type semiconductor layer, an active layer, and a p-type semiconductor layer. The semiconductor layers may be composed of, for example, a semiconductor material of a group III-V compound semiconductor, a group II-VI compound semiconductor or the like. Specifically, a nitride-based semiconductor material such as $In_XAl_YGa_{1-X-Y}N$ ($0 \leq X$, $0 \leq Y$, $X+Y \leq 1$) may be used (for example, InN, AlN, GaN, InGaN, AlGaN, InGaAlN or the like).

Figure 4:
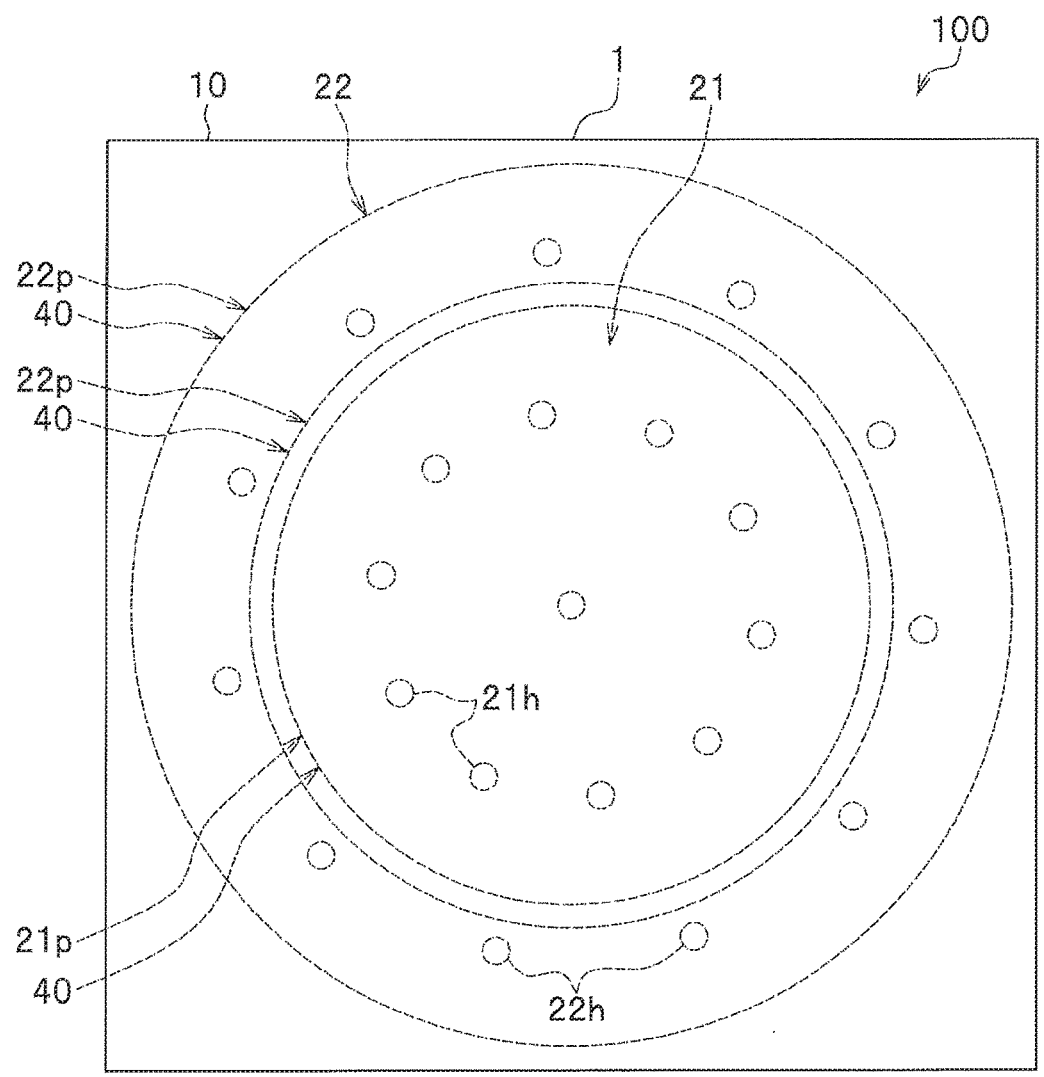
FIG. 4 is a top view schematically showing a light emitting element and a light emitting device according to a first embodiment.

In the semiconductor stacked-layer body 20, a cathode terminal of the external connection electrodes 8 is connected to the n-type semiconductor layer, and anode terminal of the external connection electrodes 8 is connected to the p-type semiconductor layer. As shown in FIG. 4, in a plan view, the semiconductor stacked-layer body 20 includes a first semiconductor region 21, and a second semiconductor region 22 provided around the first semiconductor region 21.

Figure 6:
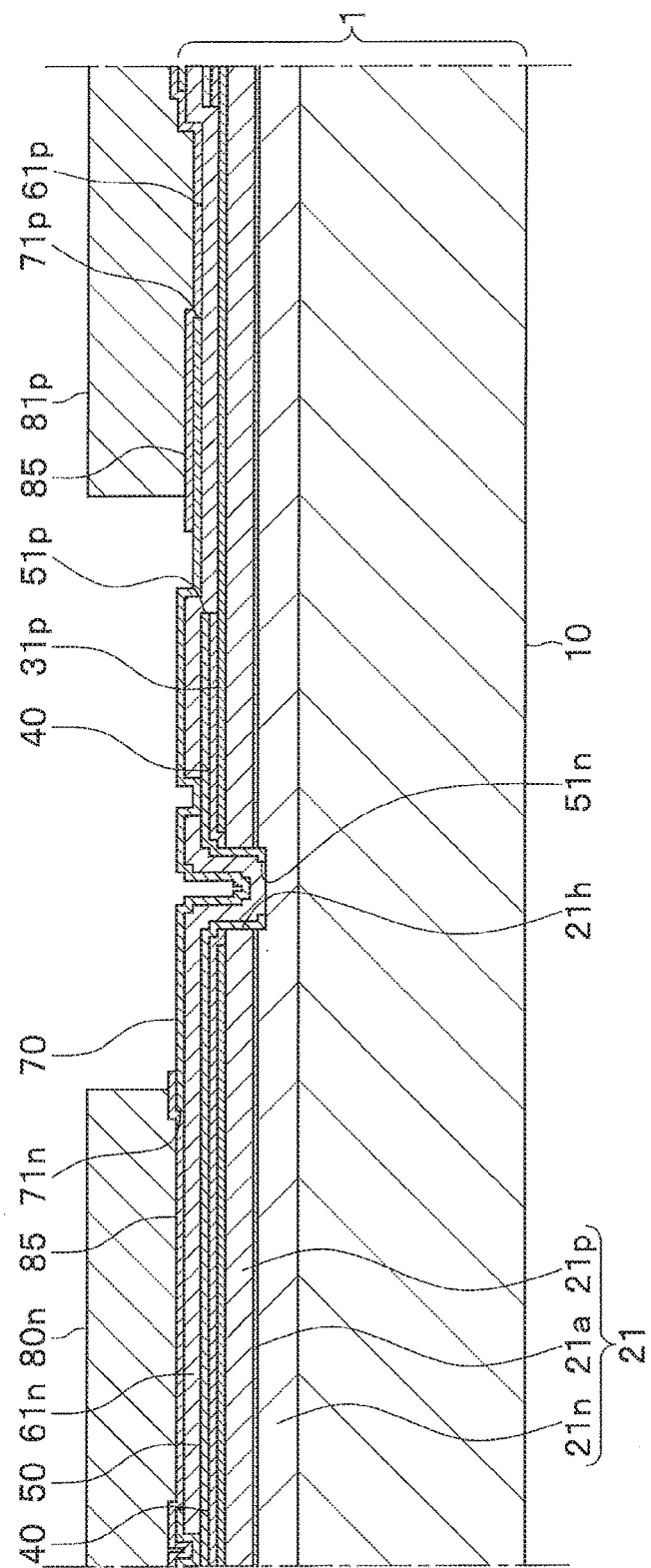
FIG. 6 is a cross-sectional view taken along line VI-VI in FIG. 5.

The first semiconductor region 21 is provided with first holes 21h that penetrate through the p-type semiconductor layer to expose the n-type semiconductor layer (see FIG. 6). The second semiconductor region 22 is provided with second holes 22h that penetrate through the p-type semiconductor layer to expose the n-type semiconductor layer (see FIG. 7). The first holes 21h and the second holes 22h are formed by removal of the p-type semiconductor layer, the active layer, and part of the n-type semiconductor layer above the light-transmissive substrate 10. The p-type semiconductor layer in the first semiconductor region 21 and the p-type semiconductor layer in the second semiconductor region 22 are separated from each other, and therefore the first semiconductor region 21 and the second semiconductor region 22 can emit light independently of each other. In the light emitting element 1, the first semiconductor region 21 serves as the first light emitting portion, and the second semiconductor region 22 serves as the second light emitting portion.

In the following description, the p-type semiconductor layer in the first semiconductor region 21 is referred to as a first p-type semiconductor layer 21p. Similarly, the p-type semiconductor layer in the second semiconductor region 22 is referred to as a second p-type semiconductor layer 22p. Note that, the n-type semiconductor layer is continuously formed across the first semiconductor region 21 and the second semiconductor region 22, and simply referred to as an n-type semiconductor layer 21n.

The external connection electrodes 8 are provided opposite to the light-transmissive substrate 10 of the light emitting element 1 with reference to the semiconductor stacked-layer body 20. The external connection electrodes 8 include an n-side external connection electrode 80n, a first p-side external connection electrode 81p, and a second p-side external connection electrode 82p. The n-side external connection electrode 80n is a cathode terminal shared by the first semiconductor region 21 and the second semiconductor region 22. Such a shared cathode terminal simplifies the mounting of the light emitting device 100, and additionally improves heat releasing property by virtue of the increased bonding area with the mounting substrate. Further, the first p-side external connection electrode 81p is an anode terminal for the first semiconductor region 21. The second p-side external connection electrode 82p is an anode terminal for the second semiconductor region 22.

[Wavelength Conversion Member 9]

The wavelength conversion member 9 has its lower surface opposed to the light emitting surface of the light emitting element 1, and covers at least part of the light emitting surface of the light emitting element 1. The wavelength conversion member 9 is excited by part of light emitted from the light emitting element 1, and emits light having a wavelength different from that of the light from the light emitting element 1. As shown in FIG. 2, the wavelength conversion member 9 covers the entire light emitting surface of the light emitting element 1. The outer circumferential surface (outer side surface) of the wavelength conversion member 9 is positioned outside the outer side surface of the light emitting element 1. The wavelength conversion member 9 includes a first fluorescent material layer 91, a second fluorescent material layer 92, and a light-transmissive member 93.

In a plan view, the first fluorescent material layer 91 covers the first semiconductor region 21 of the light emitting element 1. That is, in a plan view, the first fluorescent material layer 91 covers the first p-type semiconductor layer 21p of the light emitting element 1. The first fluorescent material layer 91 includes a fluorescent material (hereinafter referred to as a first fluorescent material) and a light-transmissive member. Similarly, the second fluorescent material layer 92 includes a fluorescent material (hereinafter referred to as a second fluorescent material) and a light-transmissive member. The wavelength of a fluorescence in the second fluorescent material layer 92 gets longer than that in the first fluorescent material layer 91.

An exemplary first fluorescent material may be a fluorescent material containing a rare-earth element, specifically, a garnet-type fluorescent material that contains at least one element selected from the group consisting of Y, Lu, Sc, La, Gd, Tb, and Sm, and at least one element selected from the group consisting of Al, Ga, and In. In particular, an aluminum-garnet-based fluorescent material contains Al and at least one element selected from the group consisting of Y, Lu, Sc, La, Gd, Tb, Eu, Ga, In, and Sm, and activated by at least one element selected from the rare-earth elements. The aluminum-garnet-based fluorescent material emits light by being excited with visible light or ultraviolet light emitted from the light emitting element 1. Exemplary fluorescent materials include an yttrium-aluminum-oxide-based fluorescent material (a YAG-based fluorescent material), $Tb_{2.95}Ce_{0.05}Al_5O_{12}$, $Y_{2.90}Ce_{0.05}Tb_{0.05}Al_5O_{12}$, $Y_{2.94}Ce_{0.05}Pr_{0.01}Al_5O_{12}$, $Y_{2.90}Ce_{0.05}Pr_{0.05}Al_5O_{12}$ and the like. Of these, particularly in the present embodiment, yttrium-aluminum-oxide-based fluorescent materials of two or more types that contain Y, is activated by Ce or Pr, and differ from each other in composition are used.

In a plan view, the second fluorescent material layer 92 annularly surrounds the first fluorescent material layer 91, and covers the second semiconductor region 22 of the light emitting element 1. That is, in a plan view, the second fluorescent material layer 92 covers the second p-type semiconductor layer 22p of the light emitting element 1.

The second fluorescent material layer 92 preferably includes, for example, a nitride-based fluorescent material as the second fluorescent material. The nitride-based fluorescent material contains N, and further contains at least one element selected from the group consisting of Be, Mg, Ca, Sr, Ba, and Zn, and at least one element selected from the group consisting of C, Si, Ge, Sn, Ti, Zr, and Hf, and is activated by at least one element selected from the rare-earth elements. Exemplary nitride-based fluorescent materials include $(Sr_{0.97}Eu_{0.03})_2Si_5N_8$, $(Ca_{0.985}Eu_{0.015})_2Si_5N_8$, $(Sr_{0.679}Ca_{0.291}Eu_{0.03})_2Si_5N_8$, and the like.

<Light-Transmissive Member 93>

The light-transmissive member 93 is provided between the first fluorescent material layer 91 and the second fluorescent material layer 92, and around the second fluorescent material layer 92. This allows the Fresnel lens 6 to efficiently use light extracted from the first fluorescent material layer 91 and light extracted from the second fluorescent material layer 92. The light-transmissive resin composing the light-transmissive member 93 may be thermosetting resin such as silicone resin, silicone-modified resin, epoxy resin, phenolic resin or the like, or thermoplastic resin such as polycarbonate resin, aclyric resin, methylpentene resin, polynorbornene resin or the like. In particular, silicone resin which exhibits excellent lightfastness and heat-resistance is suitable. Further, the light-transmissive member 93 may be replaced by a light-shielding member such as a metal film, which also enables extraction of light from each of the fluorescent material layers 91 and 92. Further, the light-transmissive member 93 can be dispensed with, and the first fluorescent material layer 91 and the second fluorescent material layer 92 may be in contact with each other, and the second fluorescent material layer 92 and a light reflecting member 7a, which is described below, may be in contact with each other.

The light reflecting member 7a is provided around the wavelength conversion member 9. The light reflecting member 7a covers the outer circumference of the wavelength conversion member 9, and preferably is in contact with the wavelength conversion member 9. This reduces leakage of light from the side surface of the wavelength conversion member 9. As a result, the difference in the output between light extracted from the first fluorescent material layer 91 and light extracted from the second fluorescent material layer 92 can be reduced, and the wavelength conversion member 9 can be held by the light reflecting member 7a. Therefore, the light reflecting member 7a is preferably in contact with the entire side surface of the wavelength conversion member 9. Thus, leakage of light from the side surface of the wavelength conversion member 9 is effectively reduced and the wavelength conversion member 9 can be surely held.

In the example shown in FIGS. 2 and 3, a light reflecting member 7b covers the side surface and part of the lower surface of the light emitting element 1 while exposing the surfaces of the external connection electrodes 8. The light reflecting member 7b is in contact with one surface of a circumferential portion 301 of the second fluorescent material layer 92 of the wavelength conversion member 9, which one surface is on the light-transmissive substrate 10 side. The light reflecting member 7b is in contact with the lower surface of the light reflecting member 7a, and protects the light emitting element 1 with the light reflecting member 7a. Further, since the light output from the side surface of the light emitting element 1 is reflected at the interface between the light reflecting member 7b and the light reflecting member 7a and can be extracted via the wavelength conversion member 9, the light extraction efficiency improves. The bottom surface of the light reflecting member 7b is formed to be substantially flat. At that bottom surface, the surfaces of the external connection electrodes 8 are exposed. The bottom surface of the light reflecting member 7b is the mounting surface side of the light emitting device 100. Note that, a light-transmissive member may be provided across the circumferential portion 301 of the second fluorescent material layer 92 and the side surface of the light-transmissive substrate 10. Then, since the light output from the side surface of the light emitting element 1 can be reflected at the interface between this light-transmissive member and the light reflecting member 7b toward the wavelength conversion member 9, the light extraction efficiency further improves.

<Light-Reflective Members 7a, 7b>

The light reflecting member 7a and the light reflecting member 7b may be composed of light reflecting resin. The light reflecting resin refers to resin that has high reflectivity to light from the light emitting element 1, and for example, refers to resin having a reflectivity of 70% or more. The light reflecting resin is, for example, light-transmissive resin in which a light reflecting substance is dispersed. Suitably, the light reflecting substance is, for example, titanium oxide, silicon dioxide, titanium dioxide, zirconium dioxide, potassium titanate, alumina, aluminum nitride, boron nitride, mullite or the like. The light reflecting substance may be granular, fibrous, or flaky. In particular, a fibrous light reflecting substance is preferable because it exhibits also the effect of reducing the thermal expansion coefficient of the light reflecting member 7a and the light reflecting member 7b, thereby reducing the difference in the thermal expansion coefficient between, for example, the light reflecting member 7a and the light reflecting member 7b and the light emitting element 1. The resin material as the light reflecting resin is particularly preferably thermosetting light-transmissive resin such as silicone resin, silicone-modified resin, epoxy resin, or phenolic resin.

[Fresnel Lens 6]

The Fresnel lens 6 is a thin lightweight lens that has the refraction property similar to that of a convex lens. The Fresnel lens 6 receives light at one surface (a flat surface) and outputs the light from other surface (a concentrically shaped surface) to be converged forward. The Fresnel lens 6 is mounted such that its center substantially agrees with the center of the first fluorescent material layer 91 of the wavelength conversion member 9, and the center of the first semiconductor region 21 of the light emitting element 1. As shown in FIG. 1, the Fresnel lens 6 covers the entire light output surface of the first fluorescent material layer 91 and the second fluorescent material layer 92 of the wavelength conversion member 9. Note that, the outer circumferential edge of the Fresnel lens 6 is disposed outside the second fluorescent material layer 92.

The light source 2 integrating the Fresnel lens 6, the light emitting device 100, and the wavelength conversion member 9 can be installed in an external apparatus unit. Alternatively, the Fresnel lens 6 may be previously provided in the apparatus unit where the light source 2 is to be implemented. Then, mounting the light emitting device 100 and the wavelength conversion member 9 on the apparatus unit can implement the light source 2.

Next, with reference to FIGS. 4 to 8, a detailed description will be given of the light emitting element 1.

[Light Emitting Element 1]

As shown in FIGS. 4 to 8, the light emitting element 1 includes the light-transmissive substrate 10, the first semiconductor region 21, the second semiconductor region 22, a first p-side light reflecting layer 31p, a second p-side light reflecting layer 32p, a cover electrode 40, an interlayer insulating film 50, a first p-side electrically conductive layer 61p, a first n-side electrode 61n, a second p-side electrically conductive layer 62p, a second n-side electrode 62n, and an insulating protective film 70.

On the insulating protective film 70, the n-side external connection electrode 80n, the first p-side external connection electrode 81p, and the second p-side external connection electrode 82p (hereinafter also collectively referred to as the external connection electrodes 8) are provided.

As shown in FIGS. 4 to 6 and 11, the light emitting element 1 includes, at the first semiconductor region 21, the first n-side electrode 61n, and the first p-side light reflecting layer 31p as a first p-side electrode provided on the first p-type semiconductor layer 21p.

As shown in FIGS. 4, 5, 7, 8 and 11, the light emitting element 1 includes, at the second semiconductor region 22, the second n-side electrode 62n, and the second p-side light reflecting layer 32p as a second p-side electrode provided on the second p-type semiconductor layer 22p.

<Light-Transmissive Substrate 10>

The light-transmissive substrate 10 may be composed of, for example, a light-transmissive insulating material such as sapphire ($Al_2O_3$), or a semiconductor material such as gallium nitride (GaN). This light-transmissive substrate 10 may be thinned by polishing.

<First Semiconductor Region 21>

As shown in FIG. 6, the first semiconductor region 21 includes the n-type semiconductor layer 21n, a first active layer 21a, and the first p-type semiconductor layer 21p, which are provided above the light-transmissive substrate 10. These semiconductor layers may each have a single-layer structure, or may have a stacked-layer structure made up of layers of different composition or thickness, or a superlattice structure. In particular, the first active layer 21a preferably has a single quantum well structure or a multi quantum well structure in which thin films exhibiting the quantum effect are stacked.

As shown in FIG. 4, the outer edge of the first p-type semiconductor layer 21p in a plan view is preferably circular, such that the Fresnel lens 6 is effectively used.

As shown in FIG. 6, the first p-type semiconductor layer 21p is provided above part of the n-type semiconductor layer 21n, and provided with the first holes 21h. The first p-type semiconductor layer 21p is provided with a plurality of first holes 21h. The plurality of first holes 21h are arranged along the outer edge portion of the first p-type semiconductor layer 21p, whereby the current is more evenly supplied to the first semiconductor region 21. Further, the circularly arranged first holes 21h enables light emission that makes full use of the Fresnel lens 6. Further, the plurality of first holes 21h may be arranged substantially at regular intervals.

In each first hole 21h, the first p-type semiconductor layer 21p, the first active layer 21a, and part of the n-type semiconductor layer 21n are removed above the light-transmissive substrate 10. The bottom surface of the first hole 21h is the exposed surface of the n-type semiconductor layer 21n. The side surface of the first hole 21h is covered by the interlayer insulating film 50. At the bottom surface of the first hole 21h, a circular n-side opening 51n of the interlayer insulating film 50 is provided. Through the n-side opening 51n, the first n-side electrode 61n and the n-type semiconductor layer 21n are in contact with each other and electrically connected to each other. Note that, the shape of the first hole 21h may be, for example, circular or elliptic as seen from above.

The diameter of the first hole 21h can be set as appropriate depending on the size of the semiconductor stacked-layer body 20. A reduced diameter of the first hole 21h increases the light emitting region, because it reduces the partial removal area of the first active layer 21a and others. An increased diameter of the first hole 21h suppresses an increase in the forward voltage, because it increases the contact area between the first n-side electrode 61n and the n-type semiconductor layer 21n.

<Second Semiconductor Region 22>

Figure 7:
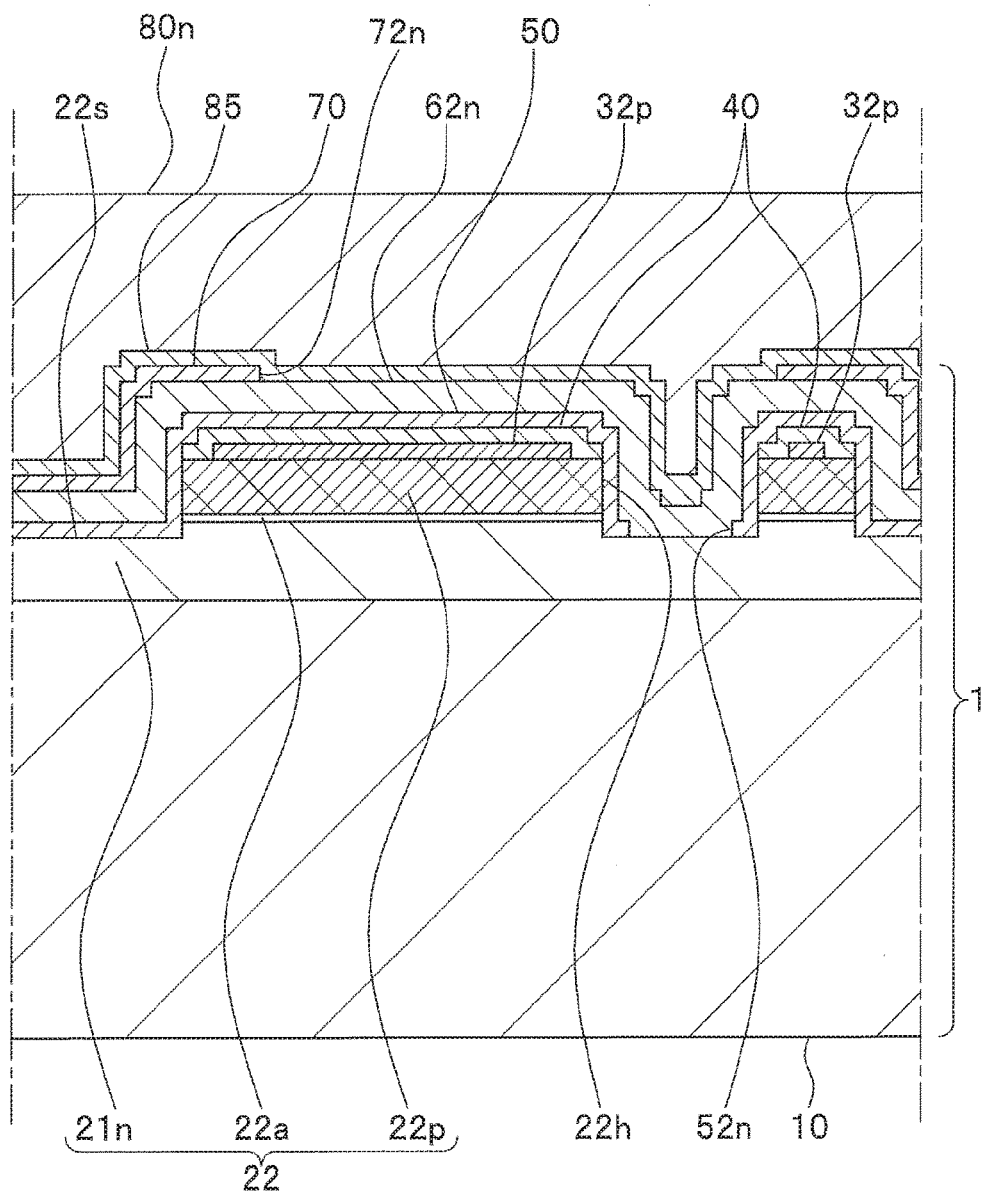
FIG. 7 is a cross-sectional view taken along line VII-VII in FIG. 5.
Figure 8:
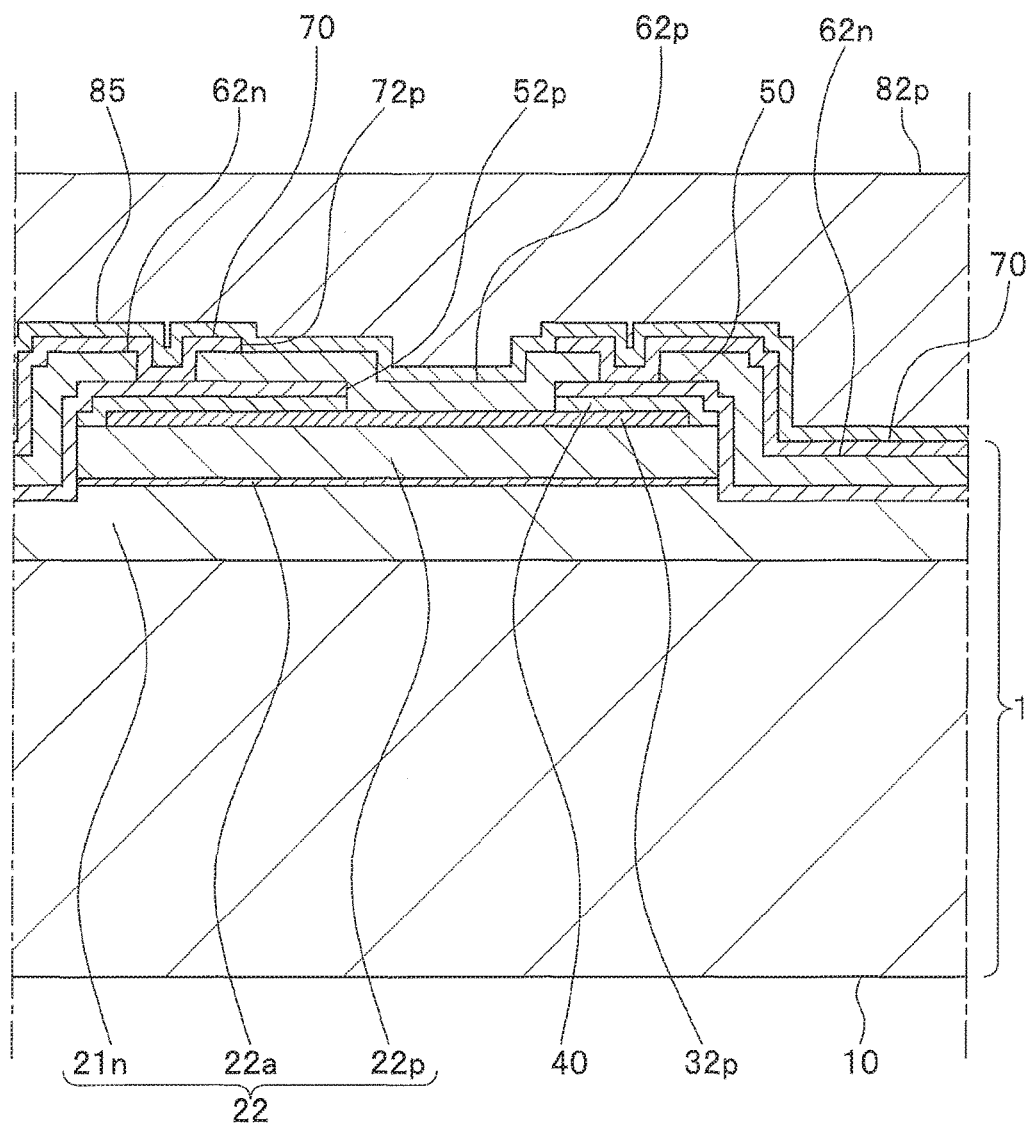
FIG. 8 is a cross-sectional view taken along line VIII-VIII in FIG. 5.

The second semiconductor region 22 is similarly structured as the first semiconductor region 21, but different from the first semiconductor region 21 in the disposition position. As shown in FIG. 4, the first semiconductor region 21 and the second semiconductor region 22 are preferably equivalent in the area in a plan view in view of the current density. As shown in FIGS. 7 and 8, the second semiconductor region 22 includes the n-type semiconductor layer 21n, a second active layer 22a, and the second p-type semiconductor layer 22p which are provided above the light-transmissive substrate 10.

As shown in FIG. 4, the outer edge of the second p-type semiconductor layer 22p in a plan view is circular. Here, the inner edge of the second p-type semiconductor layer 22p in a plan view is circular. That is, the second p-type semiconductor layer 22p is annular, which enables more effective use of the Fresnel lens 6.

As shown in FIGS. 7 and 8, the second p-type semiconductor layer 22p is provided above part of the n-type semiconductor layer 21n, and provided with the second holes 22h. The second p-type semiconductor layer 22p is provided with a plurality of second holes 22h. The plurality of second holes 22h are arranged along the inner edge portion of the second p-type semiconductor layer 22p, whereby the current is more evenly supplied to the second semiconductor region 22. Further, since the plurality of second holes 22h are arranged adjacent to the first semiconductor region 21, they also contribute toward current diffusion in the first semiconductor region 21. Still further, the plurality of second holes 22h may be arranged substantially at regular intervals. Still further, the plurality of second holes 22h are preferably arranged closer to the inner edge portion of the second p-type semiconductor layer 22p than to the outer edge portion thereof. This minimizes the entire length of the second n-side electrode 62n integrally connecting the plurality of second holes 22h, which suppresses an increase in the forward voltage attributed to wiring resistance.

In each second hole 22h, the second p-type semiconductor layer 22p, the second active layer 22a, and part of the n-type semiconductor layer 21n are removed above the light-transmissive substrate 10. The bottom surface of the second hole 22h is the exposed surface of the n-type semiconductor layer 21n. The side surface of the second hole 22h is covered by the interlayer insulating film 50. At the bottom surface of the second hole 22h, a circular n-side opening 52n of the interlayer insulating film 50 is provided. Through the n-side opening 52n, the second n-side electrode 62n and the n-type semiconductor layer 21n are in contact with each other and electrically connected to each other. Note that, the shape of the second hole 22h may be, for example, circular or elliptic as seen from above. The diameter of the second hole 22h can be set as appropriate depending on the size of the semiconductor stacked-layer body 20.

As shown in FIG. 7, the boundary between an outer edge portion 22s of the n-type semiconductor layer 21n and the second p-type semiconductor layer 22p is covered by the second n-side electrode 62n and the interlayer insulating film 50, and not covered by the cover electrode 40.

<First P-side Light Reflecting Layer 31p>

As shown in FIG. 6, the first p-side light reflecting layer 31p is connected to substantially the entire upper surface of the first p-type semiconductor layer 21p. The first p-side light reflecting layer 31p has openings being concentric to the first holes 21h at positions corresponding to the first holes 21h of the n-type semiconductor layer 21n (see FIG. 9). As used herein, substantially the entire upper surface refers to the region in the upper surface of the first p-type semiconductor layer 21p except for the outer edge and the inner edges around the first holes 21h. For example, the first p-side light reflecting layer 31p preferably covers 90% or more of the area of the upper surface of the first p-type semiconductor layer 21p.

The first p-side light reflecting layer 31p is a layer for evenly diffusing the current supplied via the first p-side electrically conductive layer 61p to the entire first p-type semiconductor layer 21p. Further, the first p-side light reflecting layer 31p has an excellent light reflecting property, and serves also as a layer that downwardly reflects light having emitted from the light emitting element 1, that is, toward the light extraction surface.

<Second P-side Light Reflecting Layer 32p>

The second p-side light reflecting layer 32p is similarly structured as the first p-side light reflecting layer 31p, but different from the first p-side light reflecting layer 31p in the disposition position.

As shown in FIGS. 7 and 8, the second p-side light reflecting layer 32p is connected to substantially the entire upper surface of the second p-type semiconductor layer 22p. The second p-side light reflecting layer 32p has openings being concentric to the second holes 22h at positions corresponding to the second holes 22h of the n-type semiconductor layer 21n (see FIG. 9).

The first p-side light reflecting layer 31p and the second p-side light reflecting layer 32p may be made of a metal material that has excellent electrical conductivity and light reflecting property. In particular, metal materials having an excellent light reflecting property in the visible light region suitably include Ag, Al, Pt, Rh, Ir and alloy of which main component is such metal. Further, the first p-side light reflecting layer 31p and the second p-side light reflecting layer 32p may be a single layer or stacked layers of these metal materials.

<Cover Electrode 40>

Figure 9:
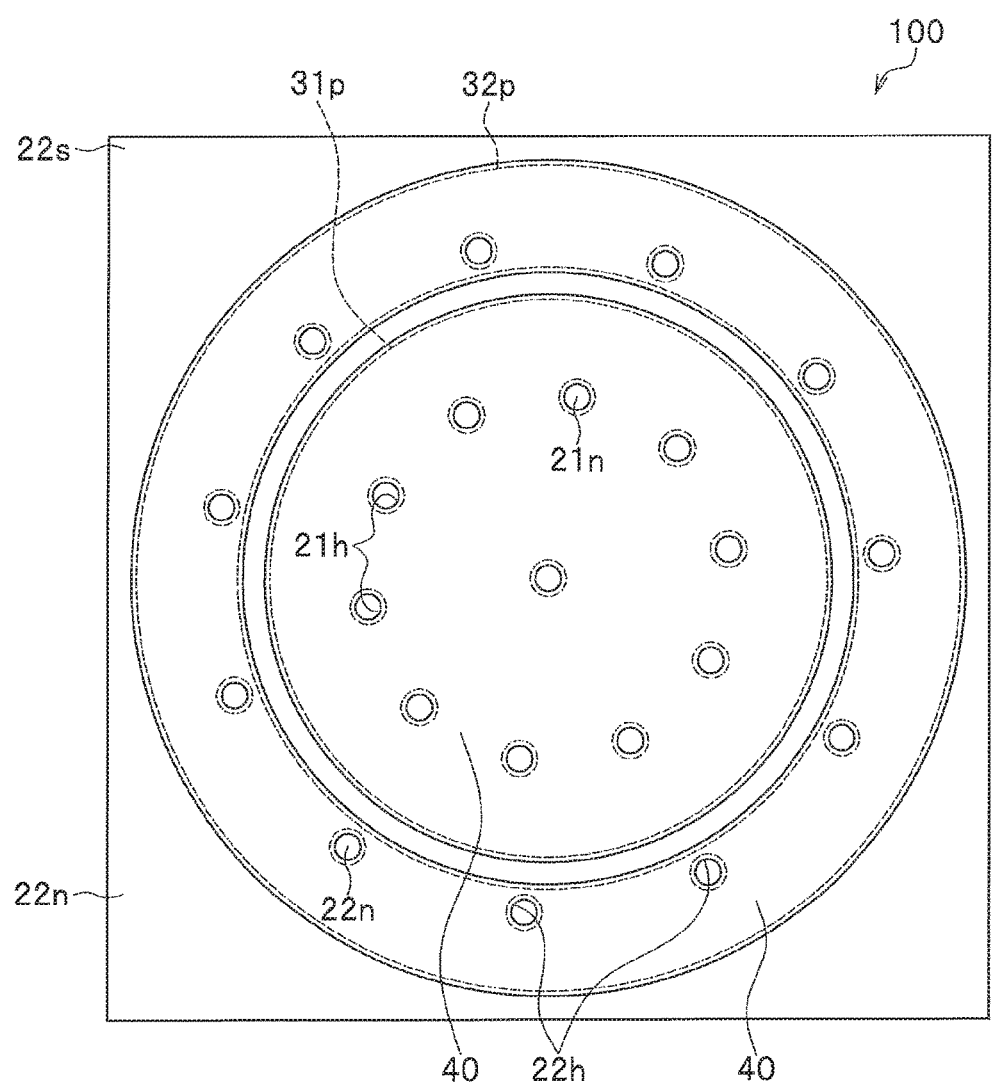
FIG. 9 is an explanatory diagram schematically showing the disposition region of a cover electrode in the light emitting device according to the first embodiment.

As shown in FIG. 9, the cover electrode 40 covers the first p-side light reflecting layer 31p and the second p-side light reflecting layer 32p. In more detail, as shown in FIG. 6, the cover electrode 40 covers part of the upper surface of the first p-side light reflecting layer 31p (the first p-side electrode) and the side surface thereof. Further, as shown in FIGS. 7 and 8, the cover electrode 40 covers part of the upper surface of the second p-side light reflecting layer 32p and the side surface thereof. The cover electrode 40 is a barrier layer for preventing migration of metal materials that compose the first p-side light reflecting layer 31p and the second p-side light reflecting layer 32p. The cover electrode 40 may be composed of metal oxide or metal nitride having a barrier property. For example, the cover electrode 40 may be composed of at least one type of oxide or nitride selected from the group consisting of Si, Ti, Zr, Nb, Ta, and Al. Further, the cover electrode 40 may be a single layer or stacked layers of these metal materials.

<Interlayer Insulating Film 50>

Figure 10:
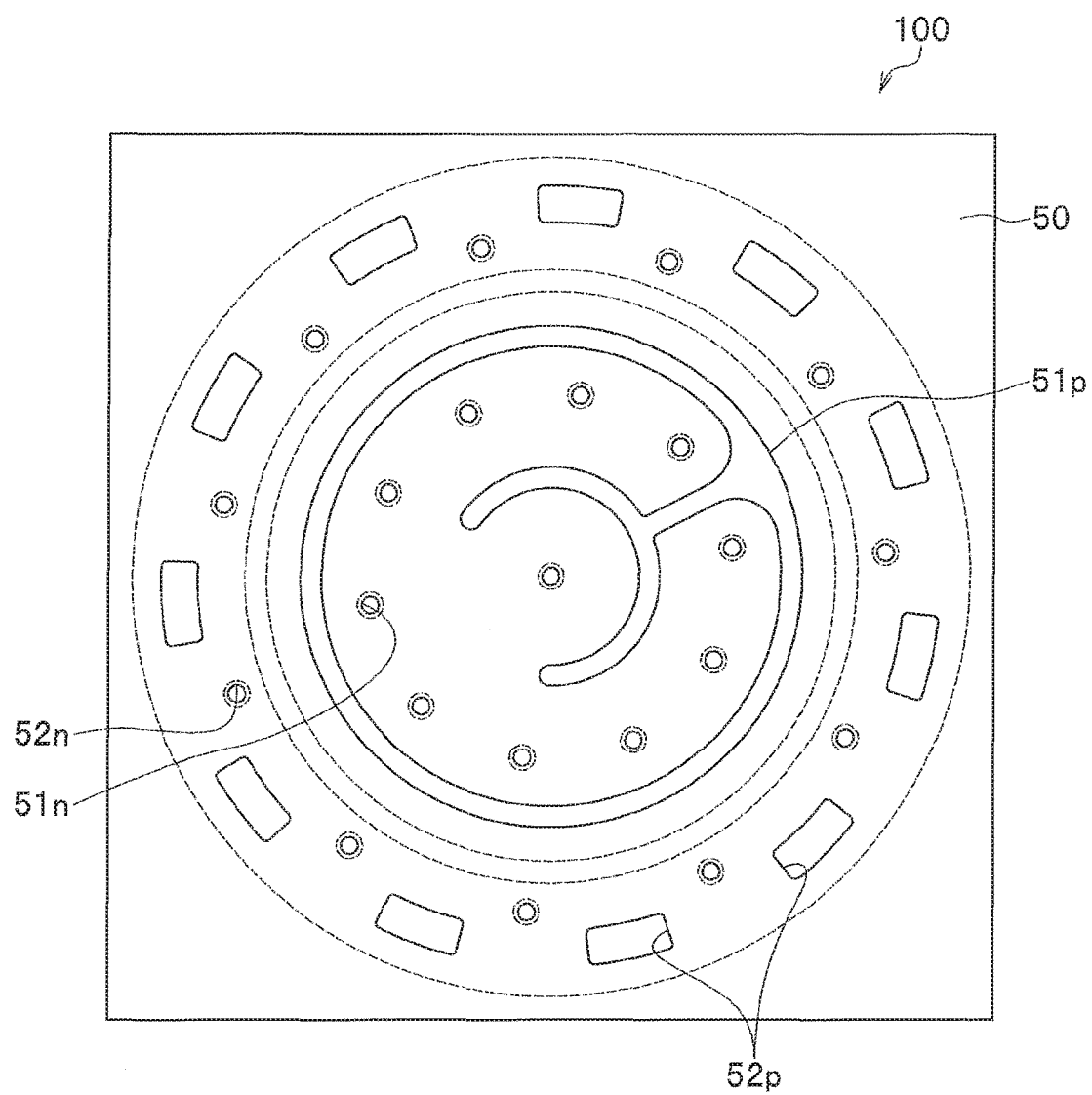
FIG. 10 is an explanatory diagram schematically showing the disposition region of an interlayer insulating film in the light emitting device according to the first embodiment.

The interlayer insulating film 50 is an insulating film provided above the semiconductor stacked-layer body 20 for extending the first n-side electrode 61n and the second n-side electrode 62n electrically connected to the n-type semiconductor layer 21n respectively above the p-type semiconductor layers 21p and 22p. Accordingly, as shown in FIG. 10, the interlayer insulating film 50 is provided above substantially the entire surface of the semiconductor stacked-layer body 20. As shown in FIG. 6, above the first semiconductor region 21, the interlayer insulating film 50 is provided at the upper and side surfaces of the cover electrode 40 and the side surface of the n-type semiconductor layer 21n. In the first semiconductor region 21, the interlayer insulating film 50 has a p-side opening 51p, and n-side openings 51n at the bottom surfaces of the first holes 21h on the n-type semiconductor layer 21n. As shown in FIG. 10, the n-side opening 51n is circular, for example. Further, the p-side opening 51p is provided in the region where the first p-side electrically conductive layer 61p is disposed.

On the other hand, as shown in FIGS. 7 and 8, above the second semiconductor region 22, the interlayer insulating film 50 is provided at the upper and side surfaces of the cover electrode 40, and the side surface of the n-type semiconductor layer 21n. In the second semiconductor region 22, the interlayer insulating film 50 has p-side openings 52p, and n-side openings 52n at the bottom surfaces of the second holes 22h on the n-type semiconductor layer 21n. Here, for example, the n-side openings 52n are circular. The p-side openings 52p are quadrangular, for example. The p-side openings 52p are provided at the region where the second p-side electrically conductive layer 62p is disposed. Herein, a plurality of p-side openings 52p are provided.

The interlayer insulating film 50 may be composed of metal oxide or metal nitride. For example, the interlayer insulating film 50 may be suitably composed of at least one type of oxide or nitride selected from the group consisting of Si, Ti, Zr, Nb, Ta, and Al. Further, the interlayer insulating film 50 may be a DBR (Distributed Bragg Reflector) film obtained by stacking two or more types of light-transmissive dielectrics differing from each other in the index of refraction.

<First N-side Electrode 61n>

Figure 11:
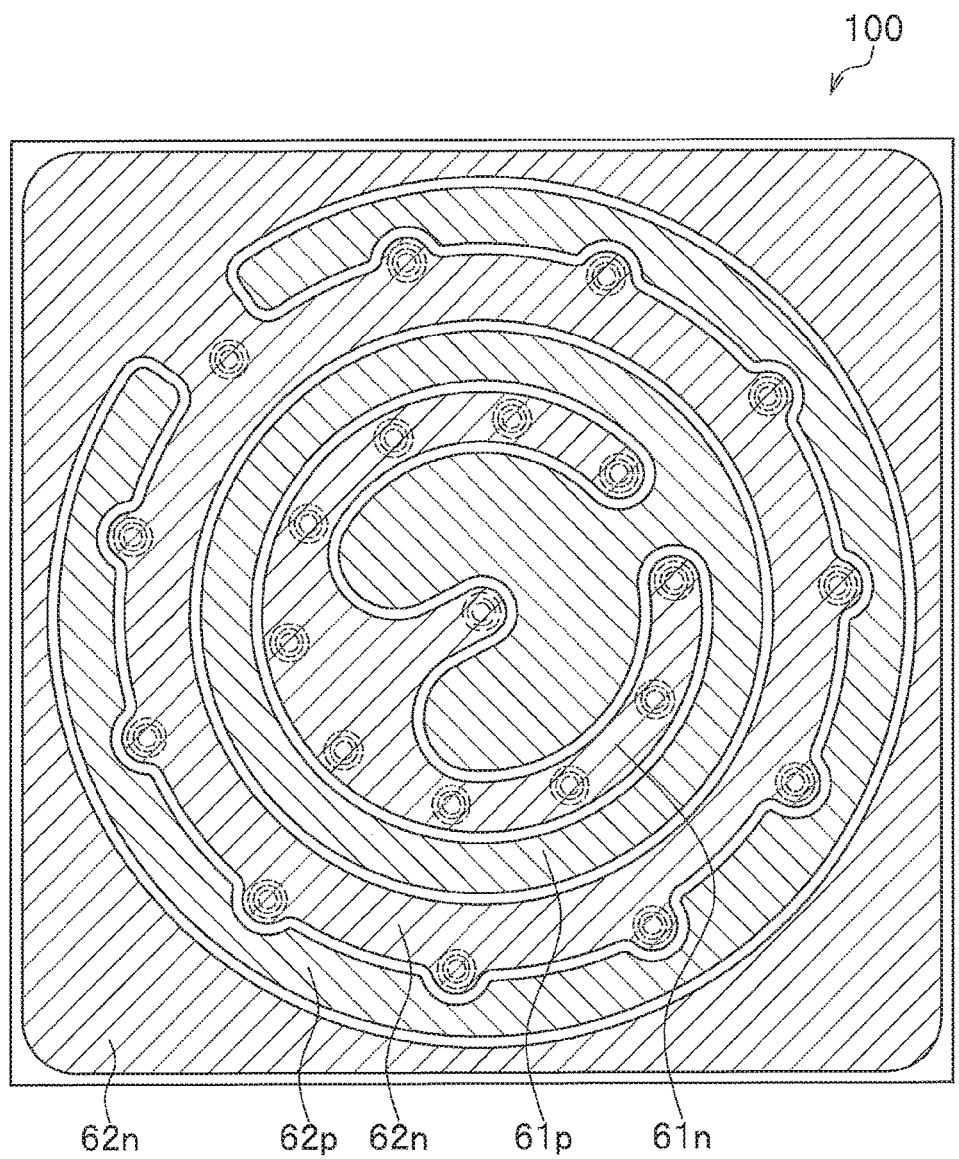
FIG. 11 is an explanatory diagram schematically showing the disposition regions of n-side electrodes and p-side electrodes in the light emitting device according to the first embodiment.

The first n-side electrode 61n is an n-side pad electrode in the first semiconductor region 21 of the light emitting element 1. As shown in FIG. 6, the first n-side electrode 61n is provided on part of the interlayer insulating film 50, and extends to the first holes 21h. The first n-side electrode 61n is connected to the n-type semiconductor layer 21n via the first holes 21h. As shown in FIG. 11, the first n-side electrode 61n extends along a plurality of first holes 21h arranged at the first semiconductor region 21, and integrally connects the plurality of first holes 21h.

The first n-side electrode 61n is electrically connected to the n-type semiconductor layer 21n through the n-side openings 51n of the interlayer insulating film 50 in the first holes 21h. Connecting the first n-side electrode 61n to the n-type semiconductor layer 21n at the points in a wide area in the plane of the first semiconductor region 21 allows the current supplied via the first n-side electrode 61n to be evenly diffused into the n-type semiconductor layer 21n at the first semiconductor region 21. Thus, the light emission efficiency improves.

<First P-side Electrically Conductive Layer 61p>

The first p-side electrically conductive layer 61p is a p-side pad electrode in the first semiconductor region 21 of the light emitting element 1. As shown in FIG. 6, the first p-side electrically conductive layer 61p is provided on part of the interlayer insulating film 50, and extends to openings of the cover electrode 40.

The first p-side electrically conductive layer 61p is provided on the first p-side light reflecting layer 31p, and electrically connected to the first p-side light reflecting layer 31p through the openings of the cover electrode 40. Further, the first p-side electrically conductive layer 61p is electrically connected to the first p-type semiconductor layer 21p via the first p-side light reflecting layer 31p. Thus, it can be regarded that the first p-side electrically conductive layer 61p forms the first p-side electrode with the first p-side light reflecting layer 31p.

The first p-side electrically conductive layer 61p is electrically connected to the first p-side external connection electrode 81p via a seed layer 85 through a p-side opening 71p of the insulating protective film 70.

<Second N-side Electrode 62n>

The second n-side electrode 62n is an n-side pad electrode in the second semiconductor region 22 of the light emitting element 1. As shown in FIG. 7, the second n-side electrode 62n is provided on part of the interlayer insulating film 50, and extends to the second holes 22h. The second n-side electrode 62n is connected to the n-type semiconductor layer 21n via the second holes 22h. As shown in FIG. 11, the second n-side electrode 62n extends along a plurality of second holes 22h arranged at the second semiconductor region 22, and integrally connects the plurality of second holes 22h.

In each second hole 22h, the second n-side electrode 62n is electrically connected to the n-type semiconductor layer 21n through the n-side opening 52n of the interlayer insulating film 50. Connecting the second n-side electrode 62n to the n-type semiconductor layer 21n at the points in a wide area in the plane of the second semiconductor region 22 allows the current supplied via the second n-side electrode 62n to be evenly diffused into the n-type semiconductor layer 21n at the second semiconductor region 22. Thus, light emission efficiency improves.

<Second P-side Electrically Conductive Layer 62p>

The second p-side electrically conductive layer 62p is a p-side pad electrode in the second semiconductor region 22 of the light emitting element 1. As shown in FIG. 8, the second p-side electrically conductive layer 62p is provided on part of the interlayer insulating film 50, and extends to the p-side openings 52p of the interlayer insulating film 50. Further, the second p-side electrically conductive layer 62p is electrically connected to the second p-side light reflecting layer 32p through the p-side openings 52p, and electrically connected to the second p-type semiconductor layer 22p via the second p-side light reflecting layer 32p. Thus, it can be regarded that the second p-side electrically conductive layer 62p forms the second p-side electrode with the second p-side light reflecting layer 32p. Further, the second p-side electrically conductive layer 62p is electrically connected to the second p-side external connection electrode 82p via the seed layer 85 through a p-side opening 72p of the insulating protective film 70.

The pad electrodes (the first n-side electrode 61n, the second n-side electrode 62n, the first p-side electrically conductive layer 61p, and the second p-side electrically conductive layer 62p) may be composed of a metal material. For example, the pad electrodes may be suitably composed of a single metal selected from Ag, Al, Ni, Rh, Au, Cu, Ti, Pt, Pd, Mo, Cr, and W, or alloy of which main component is such metal. Further preferably, the pad electrodes is composed of a single metal selected from Ag, Al, Pt, and Rh having excellent light reflecting property and alloy of which main component is such metal. Note that, when alloy is employed, the alloy may contain, as a constituent element, a non-metal element such as Si, as AlSiCu alloy does. Further, the electrically conductive layers may each be a single layer or stacked layers composed of these metal materials.

<Insulating Protective Film 70>

Figure 12:
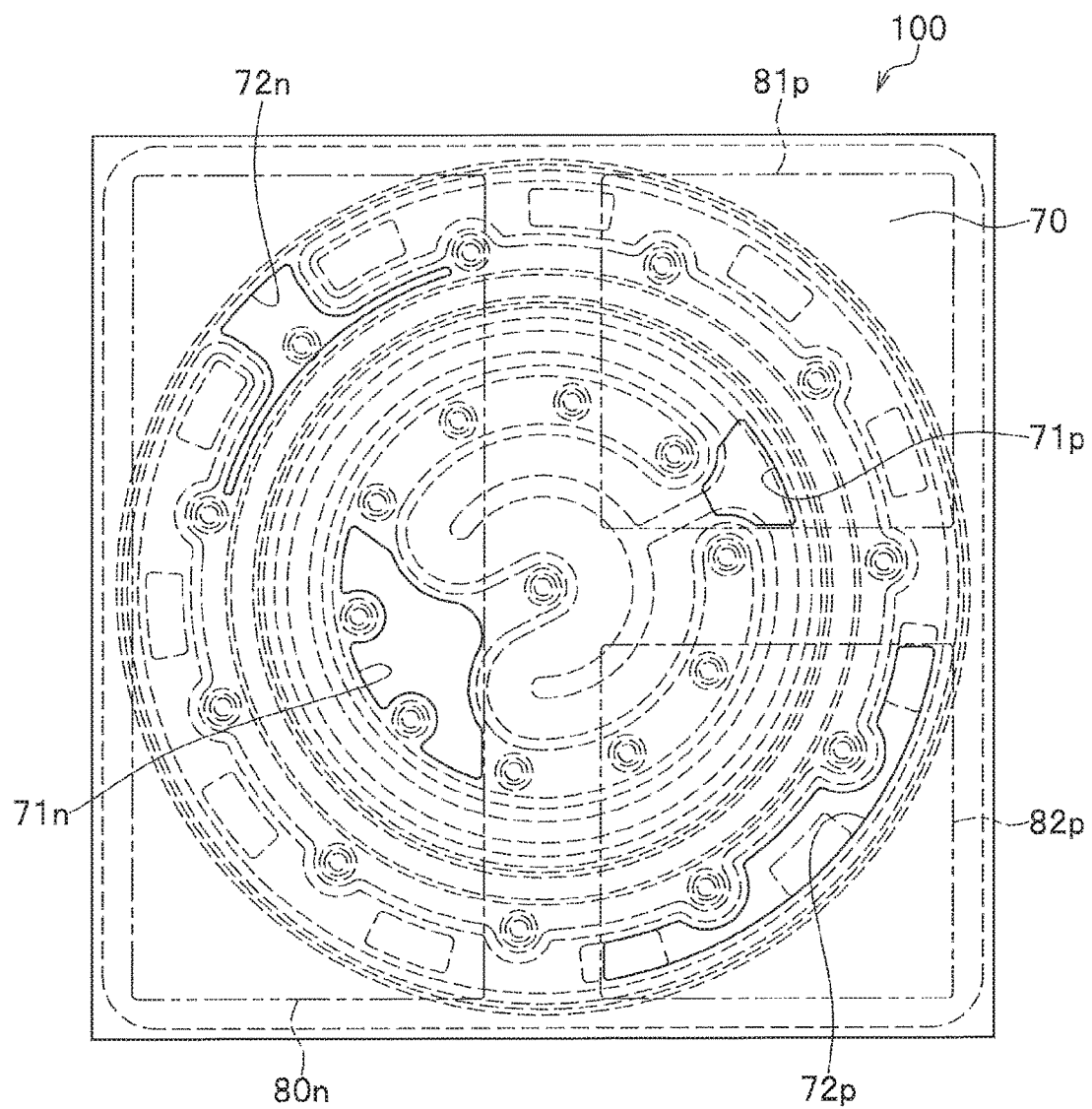
FIG. 12 is an explanatory diagram schematically showing the disposition region of an insulating protective film in the light emitting device according to the first embodiment.

The insulating protective film 70 is an insulating film provided above the semiconductor stacked-layer body 20, for protecting the light emitting element 1 from short-circuiting between the pad electrodes. As shown in FIG. 12, the insulating protective film 70 has an n-side opening 71n at a position avoiding the first holes 21h and the p-side opening 71p partially overlapping the p-side opening 51p of the interlayer insulating film 50, in the region where the external connection electrode 8 is disposed and above the first semiconductor region 21.

As shown in FIG. 12, the insulating protective film 70 has an n-side opening 72n at a position including the second hole 22h and a p-side opening 72p formed to include the p-side openings 52p of the interlayer insulating film 50, in the region where the external connection electrode 8 is disposed and above the second semiconductor region 22.

Similarly to the interlayer insulating film 50, the insulating protective film 70 may be composed of metal oxide or metal nitride.

[External Connection Electrodes 8]

Figure 5:
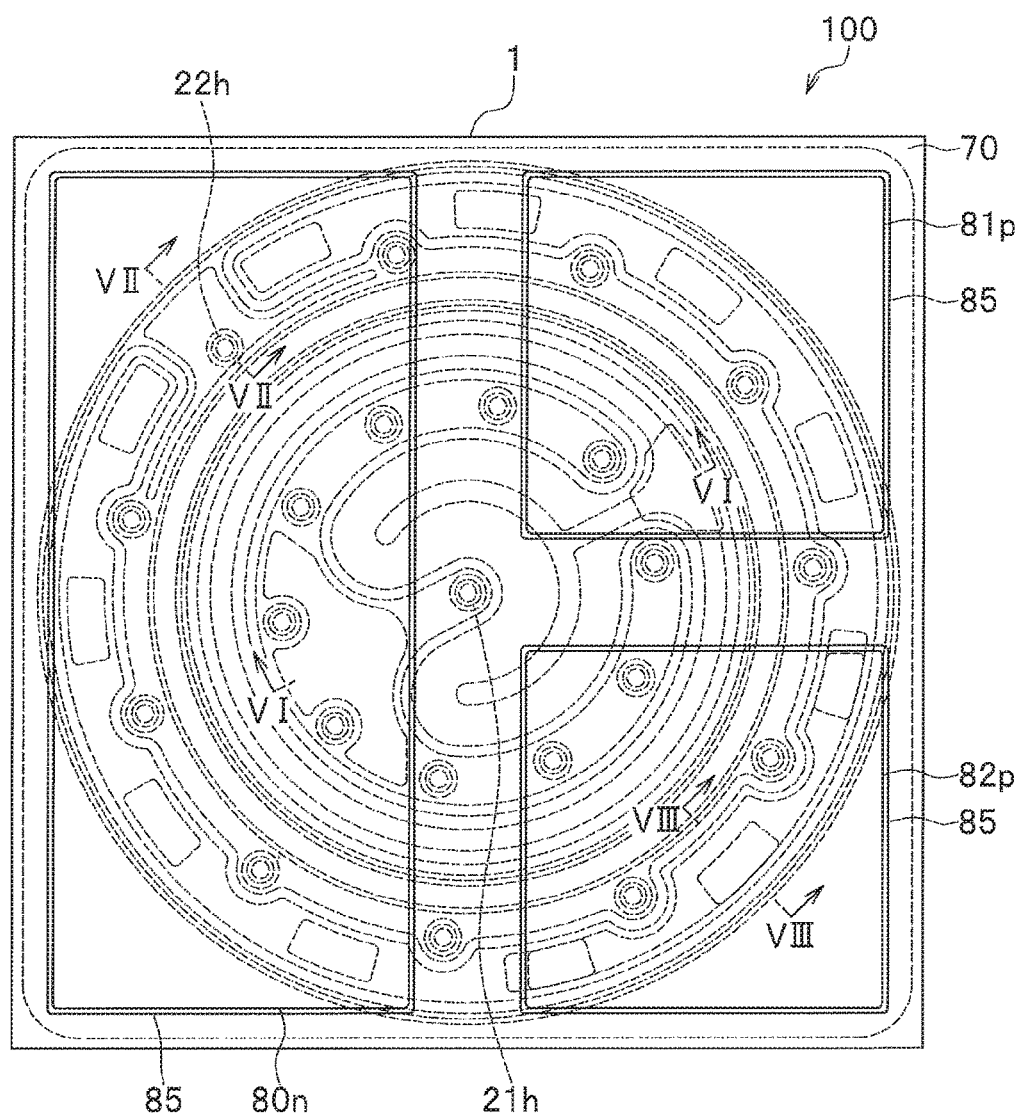
FIG. 5 is a bottom view schematically showing the light emitting element and the light emitting device according to the first embodiment.

As shown in FIG. 5, the n-side external connection electrode 80n is provided on one side (left in FIG. 5) of the light emitting element 1 which is quadrangular in a plan view. Further, the first p-side external connection electrode 81p is provided on other side (upper right in FIG. 5) opposing to the one side. Still further, the second p-side external connection electrode 82p is also provided on the other side (lower right in FIG. 5).

At the surface of the light emitting element 1, the first p-side external connection electrode 81p is spaced apart from the n-side external connection electrode 80n by a predetermined distance. Similarly, the second p-side external connection electrode 82p is spaced apart from the n-side external connection electrode 80n by a predetermined distance.

Herein, the shape of the n-side external connection electrode 80n is approximately rectangular in a plan view. The shape of the first p-side external connection electrode 81p and that of the second p-side external connection electrode 82p are each approximately square. Further, each p-side electrode is smaller than half the n-side electrode in the dimension.

Further, at the surface of the light emitting element 1, the first p-side external connection electrode 81p and the second p-side external connection electrode 82p are symmetrically disposed relative to the n-side external connection electrode 80n.

Still further, at the surface of the light emitting element 1, the first p-side external connection electrode 81p and the second p-side external connection electrode 82p are symmetrically disposed relative to each other.

In this manner, the external connection electrodes 8 are freely disposed at desired positions independently of the disposition of the first semiconductor region 21 and the second semiconductor region 22 of the light emitting element 1 and the disposition of the pad electrodes. Note that, the n-side external connection electrode 80n is connected to the first n-side electrode 61n and the second n-side electrode 62n. Further, the first p-side external connection electrode 81p is connected to the first p-side electrically conductive layer 61p. Still further, the second p-side external connection electrode 82p is connected to the second p-side electrically conductive layer 62p.

The external connection electrodes 8 may be suitably composed of metal such as Cu, Au, or Ni. The external connection electrodes 8 may be formed by electroplating.

In mounting, a bonding member is provided between the external connection electrodes 8 and an external wiring pattern. Melting and thereafter cooling the bonding member strongly joins the external connection electrode 8 and the external wiring pattern to each other. Here, the bonding member may be solder such as Sn—Au, Sn—Cu, or Sn—Ag—Cu. In this case, the uppermost layer of the external connection electrodes 8 is preferably composed of a material that can be tightly bonded to the employed bonding member.

[Operation of Light Emitting Device]

Next, with reference to FIGS. 1 to 8, a description will be given of the operation of the light emitting device 100.

In the light emitting device 100, when an external power supply is connected to the first p-side external connection electrode 81p and the n-side external connection electrode 80n via the mounting substrate, current is supplied across the first p-side electrode (the first p-side light reflecting layer 31p) and the first n-side electrode 61n of the light emitting element 1. This causes the first active layer 21a of the light emitting element 1 to emit light. The light propagates through the first semiconductor region 21 of the semiconductor stacked-layer body 20 and is output from the upper surface or side surface of the light emitting element 1 (see FIG. 3), thereby extracted to the outside. Note that, the light propagating downward in the light emitting element 1 is reflected by the first p-side light reflecting layer 31p and output from the upper surface of the light emitting element 1, thereby extracted to the outside.

In the light emitting device 100, when the external power supply is connected to the second p-side external connection electrode 82p and the n-side external connection electrode 80n via the mounting substrate, current is supplied across the second p-side electrode (the second p-side light reflecting layer 32p) and the second n-side electrode 62n of the light emitting element 1. This causes the second active layer 22a of the light emitting element 1 to emit light. The light propagates through the second semiconductor region 22 of the semiconductor stacked-layer body 20 and is output from the upper surface or side surface of the light emitting element 1 (see FIG. 3), thereby extracted to the outside. Note that, the light propagating downward in the light emitting element 1 is reflected by the second p-side light reflecting layer 32p and output from the upper surface of the light emitting element 1, thereby extracted to the outside.

In the case where a blue-color light emitting diode is employed in the light emitting device 100 and the first fluorescent material layer 91 of the wavelength conversion member 9 contains a YAG-based fluorescent material, the light from the first semiconductor region 21 of the light emitting element 1 is converted into white-color light through the first fluorescent material layer 91. Further, when the second fluorescent material layer 92 of the wavelength conversion member 9 contains a nitride-based fluorescent material, the light from the second semiconductor region 22 of the light emitting element 1 is converted into reddish-color light through the second fluorescent material layer 92.

Hence, in the light source 2, when just the first semiconductor region 21 of the light emitting element 1 is caused to emit light, white-color light is output from the wavelength conversion member 9; when just the second semiconductor region 22 is caused to emit light, reddish-color light is output from the wavelength conversion member 9. Then, the Fresnel lens 6 converges the light input thereto.

Further, in the light source 2, when the first semiconductor region 21 and the second semiconductor region 22 of the light emitting element 1 are simultaneously caused to emit light, both the white-color light and the reddish-color light are output from the wavelength conversion member 9, and the Fresnel lens 6 converges the received light of different colors. Thus, the light source 2 can emit light having been adjusted by different fluorescent materials and exhibiting excellent color rendering with improved naturalness.

Further, as shown in FIG. 1, in the light source 2, one Fresnel lens 6 covers the entire light output surface of the concentrically formed first fluorescent material layer 91 and second fluorescent material layer 92 of the wavelength conversion member 9. This provides the light source 2 being reduced in size and having excellent appearance, for example as compared to a conventional light source in which two condenser lenses are juxtaposed to each other for respective fluorescent material layers.

[Method of Manufacturing Light Emitting Device]

With reference to FIGS. 3 to 8 (and to FIGS. 9 to 12 as appropriate), a description will be given of the overview of a method of manufacturing the light emitting device 100. Firstly, the semiconductor stacked-layer body 20 is formed by successively stacking, on the upper surface of the light-transmissive substrate 10 composed of sapphire or the like, the n-type semiconductor layer, the active layer, and the p-type semiconductor layer which are composed of any of the semiconductor materials described above (Step 101).

Further, on the entire semiconductor stacked-layer body 20, light reflecting layers are formed by lift-off (Step 102). That is, a resist pattern having an opening corresponding to a region where the first p-side light reflecting layer 31p and the second p-side light reflecting layer 32p are disposed is formed by photolithography. Thereafter, the above-described metal film having an excellent reflecting property composed of Ag or the like is formed on the entire wafer by sputtering or vapor deposition. Removal of the resist pattern patterns the metal film. That is, the first p-side light reflecting layer 31p and the second p-side light reflecting layer 32p having an opening are provided.

Next, the cover electrode 40 is formed to cover the upper and side surfaces of the first p-side light reflecting layer 31p and those of the second p-side light reflecting layer 32p (Step 103). The cover electrode 40 is formed as follows. For example, an SiN film is formed over the entire wafer by sputtering or vapor deposition of SiN. Thereafter, a resist pattern having an opening except for a region where the cover electrode 40 is disposed is formed by photolithography. Etching the SiN film using the resist pattern as a mask patterns the SiN film. Thereafter, removal of the resist pattern provides the cover electrode 40 having the opening.

Then, at part of the semiconductor stacked-layer body 20, the p-type semiconductor layer, the active layer, and part of the n-type semiconductor layer are removed by dry etching. Thus, the first hole 21h, the second hole 22h, and the outer edge portion 22s where the n-type semiconductor layer 21n is exposed are formed (Step 104: see FIG. 9).

Next, the interlayer insulating film 50 is formed using a predetermined insulating material (Step 105: see FIG. 10).

Here, above the first semiconductor region 21, in forming the interlayer insulating film 50 having the p-side opening 51p, an opening is formed at the cover electrode 40 disposed in the region where the p-side opening 51p is formed. Accordingly, the p-side opening 51p and the opening of the cover electrode 40 are opened by the substantially identical dimension.

Further, above the second semiconductor region 22, in forming the interlayer insulating film 50 having the p-side openings 52p, openings are formed at the cover electrode 40 disposed in the regions where the p-side openings 52p are formed. Accordingly, the p-side openings 52p and the openings of the cover electrode 40 are opened by the substantially identical dimension.

Note that, the interlayer insulating film 50 can be patterned as follows. The insulating film is formed over the entire wafer by sputtering or the like. Thereafter, a resist pattern having the openings at the predetermined regions is formed. Then, the insulating film is patterned by etching.

Subsequently, as shown in FIG. 11, for example, on the interlayer insulating film 50 by sputtering or the like, the first n-side electrode 61n and the first p-side electrically conductive layer 61p are formed as the pad electrodes above the first semiconductor region 21, and the second n-side electrode 62n and the second p-side electrically conductive layer 62p are formed as the pad electrodes above the second semiconductor region 22 (Step 106). These pad electrodes can be patterned by, for example, lift-off. Thus, the light emitting element 1 is manufactured as a wafer. Herein, subsequently, the insulating protective film 70 is formed using a predetermined insulating material on the pad electrodes (Step 107: see FIG. 12). The insulating protective film 70 can be formed similarly to the interlayer insulating film 50. Note that, while the insulating protective film 70 is not essential for the light emitting element 1, it is preferably provided.

Next, the pad electrodes are covered by a mask having openings at the regions where the external connection electrodes 8 are disposed (Step 108). This mask is an insulating mask for preventing plating on the regions where the external connection electrodes 8 are not disposed in a later step. The mask is composed of an insulating material such as photoresist or $SiO_2$.

Next, the seed layers 85 (see FIG. 5) each serving as the current path in electroplating are formed inside the openings of the mask (Step 108), and the external connection electrodes 8 are formed by electroplating on the seed layers 85 (Step 109).

Then, the mask is removed using any appropriate solvent or agent (Step 110). Note that, the mask can be removed also by dry etching.

Finally, the wafer is cut along boundaries by dicing or scribing into a plurality of singulated light emitting devices 100 (Step 111).

Next, a description will be given of the overview of a method of manufacturing a light emitting device having the wavelength conversion member 9 such as shown in FIGS. 2 and 3.

Firstly, a plate-like reflective member is provided (Step 201). The reflective member is made of cured resin containing a light reflecting substance, and having a size corresponding to the plurality of singulated light emitting devices.

Then, openings (for example, through holes) each having a shape conforming to the outer circumferential edge of the wavelength conversion member 9 are formed at the provided reflective member (Step 202). This provides a reflective member frame in which the light reflecting members 7a of the wavelength conversion members 9 are coupled. Here, the openings may be formed by, for example, laser light irradiation, punching, etching, or blasting.

Next, each of the opening in the reflective member frame is filled with light-transmissive resin composing the light-transmissive member 93 of the wavelength conversion member 9 by potting, for example. The light-transmissive resin is cured, and a plurality of light-transmissive members are formed (Step 203).

Subsequently, in each of the cured light-transmissive members in the reflective member frame, a first opening having a shape corresponding to the first fluorescent material layer 91 of the wavelength conversion member 9 is formed, and a second opening having a shape corresponding to the second fluorescent material layer 92 is formed (Step 204).

Then, in the reflective member frame, each first opening is filled with resin containing the first fluorescent material by potting, for example, and each second opening is filled with resin containing the second fluorescent material (Step 205).

Thereafter, for example by centrifuging, the first fluorescent material and the second fluorescent material are settled (Step 206).

Further, the resins are cured in the state where the first fluorescent material and the second fluorescent material are settled. Thus, a composite sheet made up of the reflective member frame and the wavelength conversion members 9 is formed (Step 207).

Subsequently, the light emitting devices 100 are bonded to the composite sheet (Step 208). Specifically, the light-transmissive substrate 10 of each light emitting element 1 is bonded to the composite sheet with, for example, die-bonding resin being light-transmissive resin. At this time, it is preferable that the light emitting element 1 is bonded to the lower surface of the wavelength conversion member 9 so that light can be effectively extracted via the wavelength conversion member 9.

Then, resin including a light reflecting substance is caused to cover the light emitting devices 100 bonded to the composite sheet including the external connection electrodes 8, and be cured. Thus, a reflective member is formed on the composite sheet (Step 209).

Next, the upper surface of the reflective member covering the light emitting devices 100 is polished, to expose the external connection electrodes 8 of each light emitting element 1 (Step 210).

Then, the composite sheet and the reflective member thereon are cut into individual light emitting devices by dicing or the like along the division lines of the reflective member frame (Step 211).

The foregoing steps provide the light emitting device in which the light reflecting member 7a is formed around the wavelength conversion member 9 and the light reflecting member 7b is formed around the light emitting device 100.

In the light emitting device 100, the external connection electrodes 8 include the n-side external connection electrode 80n connected to the first n-side electrode 61n and the second n-side electrode 62n, the first p-side external connection electrode 81p connected to the first p-side electrode (the first p-side light reflecting layer 31p), and the second p-side external connection electrode 82p connected to the second p-side electrode (the second p-side light reflecting layer 32p).

Further, in the light emitting device 100, the first semiconductor region 21 serving as the first light emitting portion is formed at the central region of the light emitting element 1 in a plan view. The first semiconductor region 21 is provided with the first n-side electrode 61n being the n-side pad electrode, and the first p-side electrically conductive layer 61 being the p-side pad electrode.

Still further, in the light emitting device 100, the second semiconductor region 22 serving as the second light emitting portion is formed around the first semiconductor region 21 in a plan view. The second semiconductor region 22 is provided with the second n-side electrode 62n being the n-side pad electrode, and the second p-side electrically conductive layer 62 being the p-side pad electrode. Accordingly, the light emitting device 100 is provided with the n-side and p-side pad electrodes for each of the light emitting portions.

Thus, the light emitting device 100 can supply current to each of the first semiconductor region 21 (the first light emitting portion) where the first p-type semiconductor layer 21p is stacked above one n-type semiconductor layer 21n, and the second semiconductor region 22 (the second light emitting portion) provided around the first semiconductor region 21 and where the second p-type semiconductor layer 22p is stacked above the one n-type semiconductor layer 21n, via the external connection electrodes 8. Accordingly, the first light emitting portion and the second light emitting portion can be controlled independently of each other.

On the other hand, in the conventional technique as disclosed in WO2009/019836 where a sole n-side electrode (a cathode electrode) is connected to the first light emitting portion (an edge portion) or the second light emitting portion (a region inner than the edge portion), what is obtained is the current density distribution in which the current flows densely in the light emitting portion where the n-side electrode is connected, and the current density tends to become higher at a point nearer to the n-side electrode also in the plane of each of the light emitting portions.

In contrast, with the light emitting device 100 according to the present embodiment, different n-side electrodes (the first n-side electrode 61n and the second n-side electrode 62n) are respectively connected to the first semiconductor region 21 (the first light emitting portion) and the second semiconductor region 22 (the second light emitting portion).

Accordingly, with the light emitting element 1 according to the present embodiment, the current path from the first n-side electrode 61n to the first p-side electrode (the first p-side light reflecting layer 31p) in the first semiconductor region 21 and the current path from the second n-side electrode 62n to the second p-side electrode (the second p-side light reflecting layer 32p) in the second semiconductor region 22 can be well balanced with each other. Hence, the light emitting element 1 can reduce unevenness in current than the conventional light emitting element. The light emitting element 1 having the current density with reduced unevenness improves the light emission intensity distribution of the light emitting device 100 using the light emitting element 1.

Second Embodiment

Figure 13:
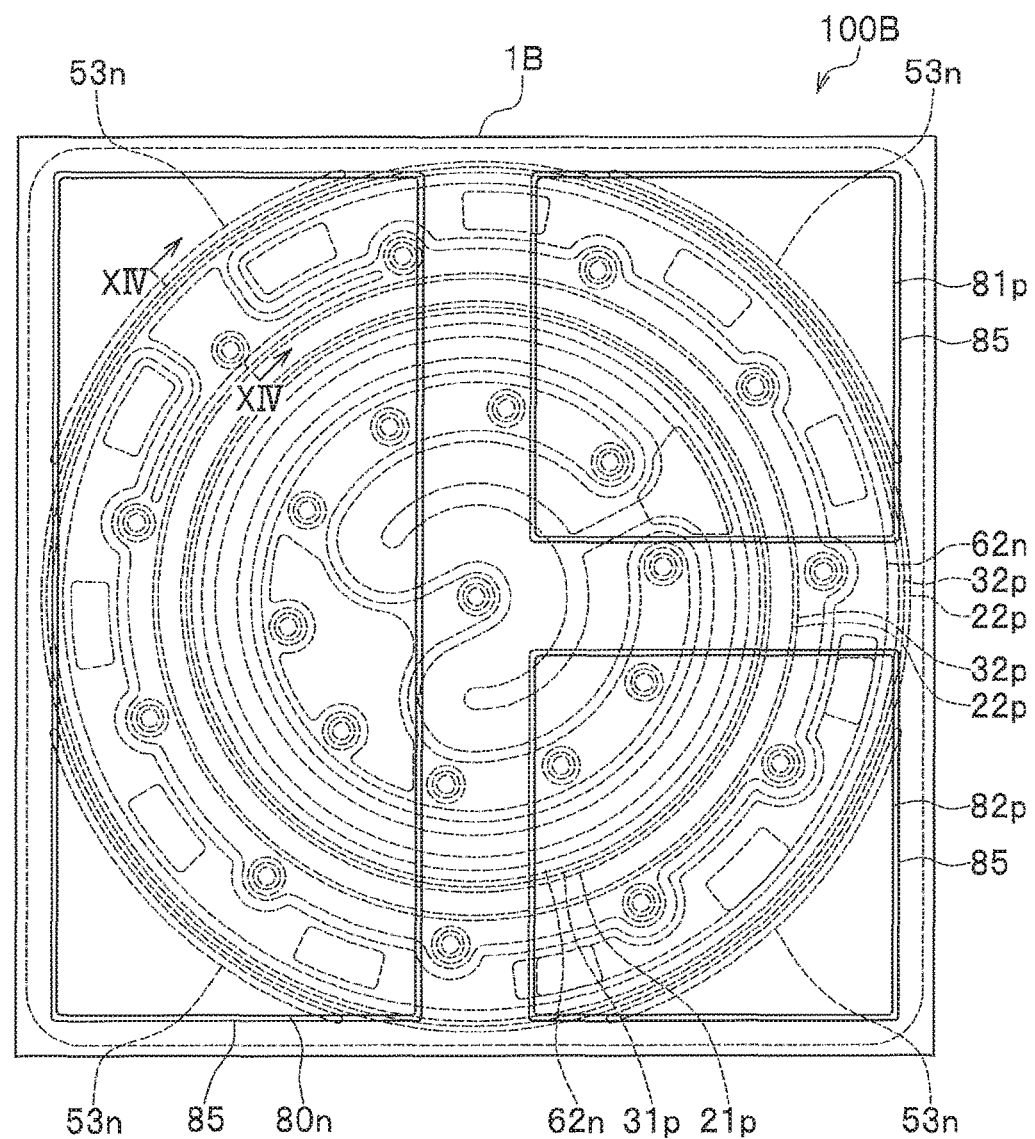
FIG. 13 is a bottom view schematically showing a light emitting element and a light emitting device according to a second embodiment.
Figure 14:
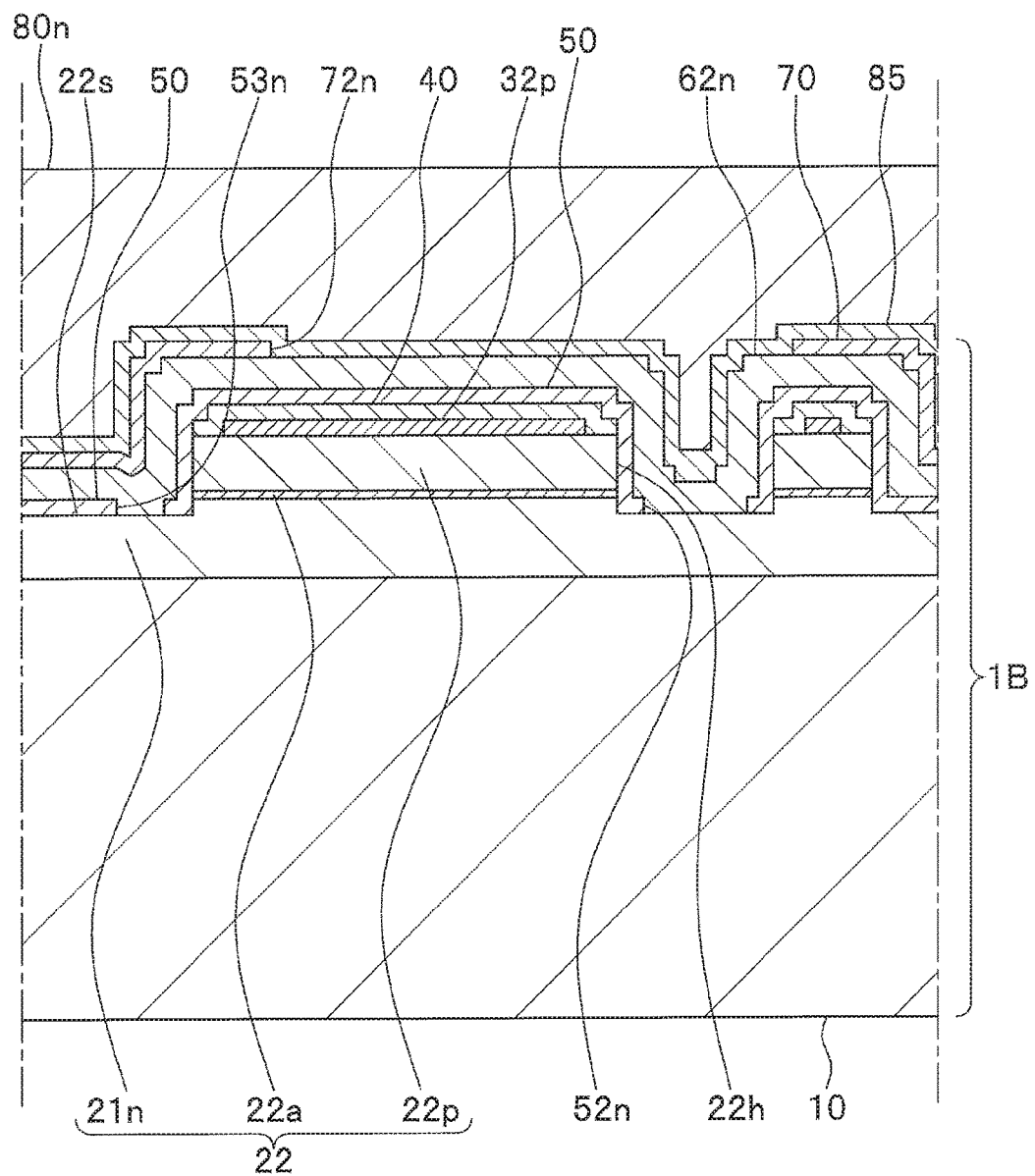
FIG. 14 is a cross-sectional view taken along line XIV-XIV in FIG. 13.

As shown in FIGS. 13 and 14, a light emitting element 1B and a light emitting device 100B according to the second embodiment are different from the light emitting element 1 and the light emitting device 100 according to the first embodiment in the openings of the interlayer insulating film 50. In the following, constituent members similar to those of the light emitting device 100 are denoted by like reference characters, and the description thereof will not be repeated.

The light emitting device 100B includes the light emitting element 1B, the external connection electrodes 8 (the n-side external connection electrode 80n, the first p-side external connection electrode 81p, and the second p-side external connection electrode 82p).

In the light emitting element 1B, the interlayer insulating film 50 includes n-side openings 53n on the outer circumference side of the second semiconductor region 22 (left in FIG. 14). Herein, the outer edge portion 22s of the n-type semiconductor layer 21n is positioned outer than the second p-type semiconductor layer 22p in a plan view. As shown in FIG. 14, the second n-side electrode 62n extends from above the outer edge portion of the second p-type semiconductor layer 22p onto the outer edge portion 22s of the n-type semiconductor layer 21n. The second n-side electrode 62n is connected to the outer edge portion 22s of the n-type semiconductor layer 21n, and capable of reflecting light, which will otherwise be extracted from the side surface of the second p-type semiconductor layer 22p, toward the light extraction surface. As shown in FIG. 13, part of the second n-side electrode 62n is disposed along the second p-type semiconductor layer 22p in a plan view.

In the light emitting element 1B according to the second embodiment, the second n-side electrode 62n is in contact with the n-type semiconductor layer 21n in the second holes 22h, and also in contact with the outer edge portion 22s of the semiconductor stacked-layer body 20 through the n-side openings 53n of the interlayer insulating film 50.

In the light emitting element 1B, the second n-side electrode 62n is in contact with the n-type semiconductor layer 21n at the outer edge portion 22s of the semiconductor stacked-layer body 20 in this manner. Therefore, the light emitting device 100B using the light emitting element 1B suppresses an increase in the forward voltage, and improves the light emission output.

Third Embodiment

Figure 15:
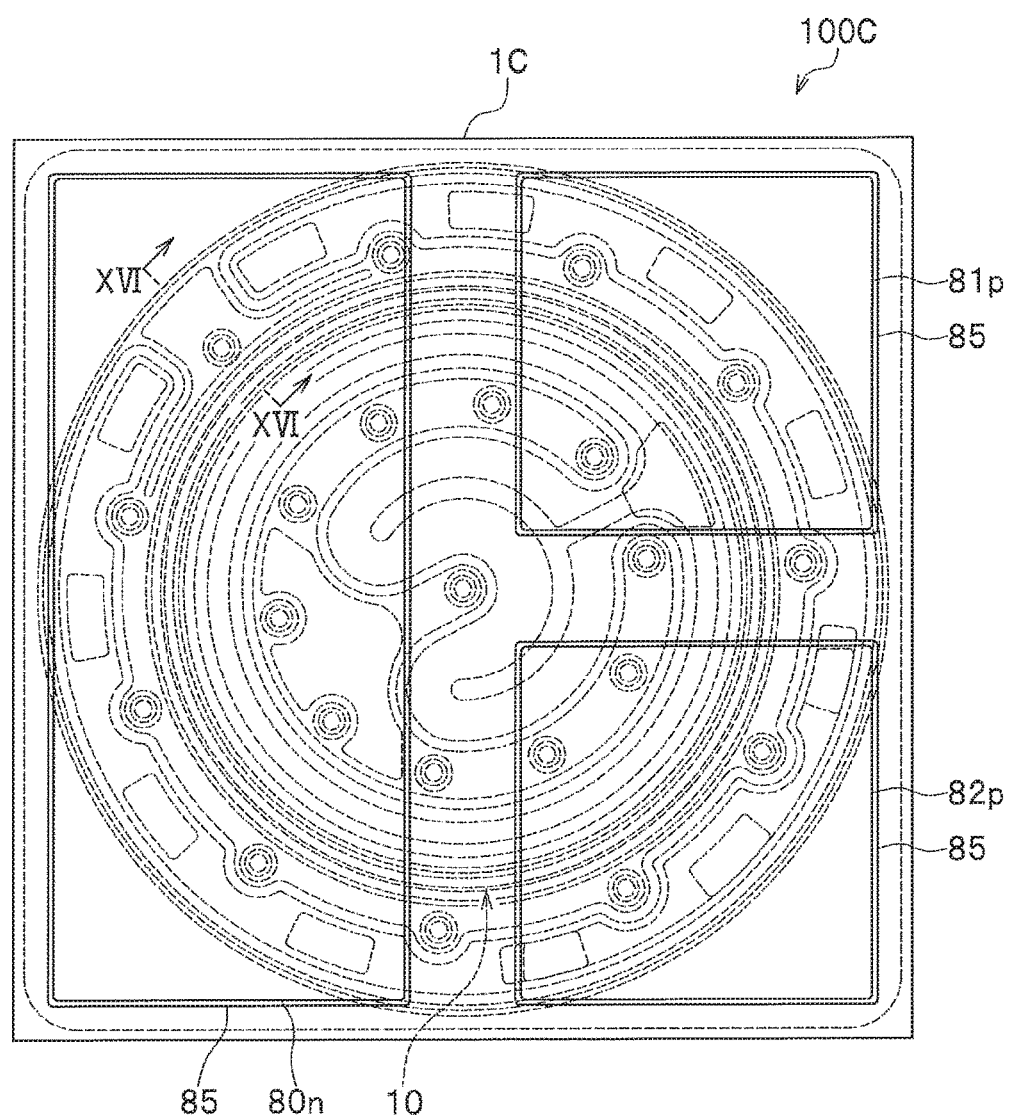
FIG. 15 is a bottom view schematically showing a light emitting element and a light emitting device according to a third embodiment.
Figure 16:
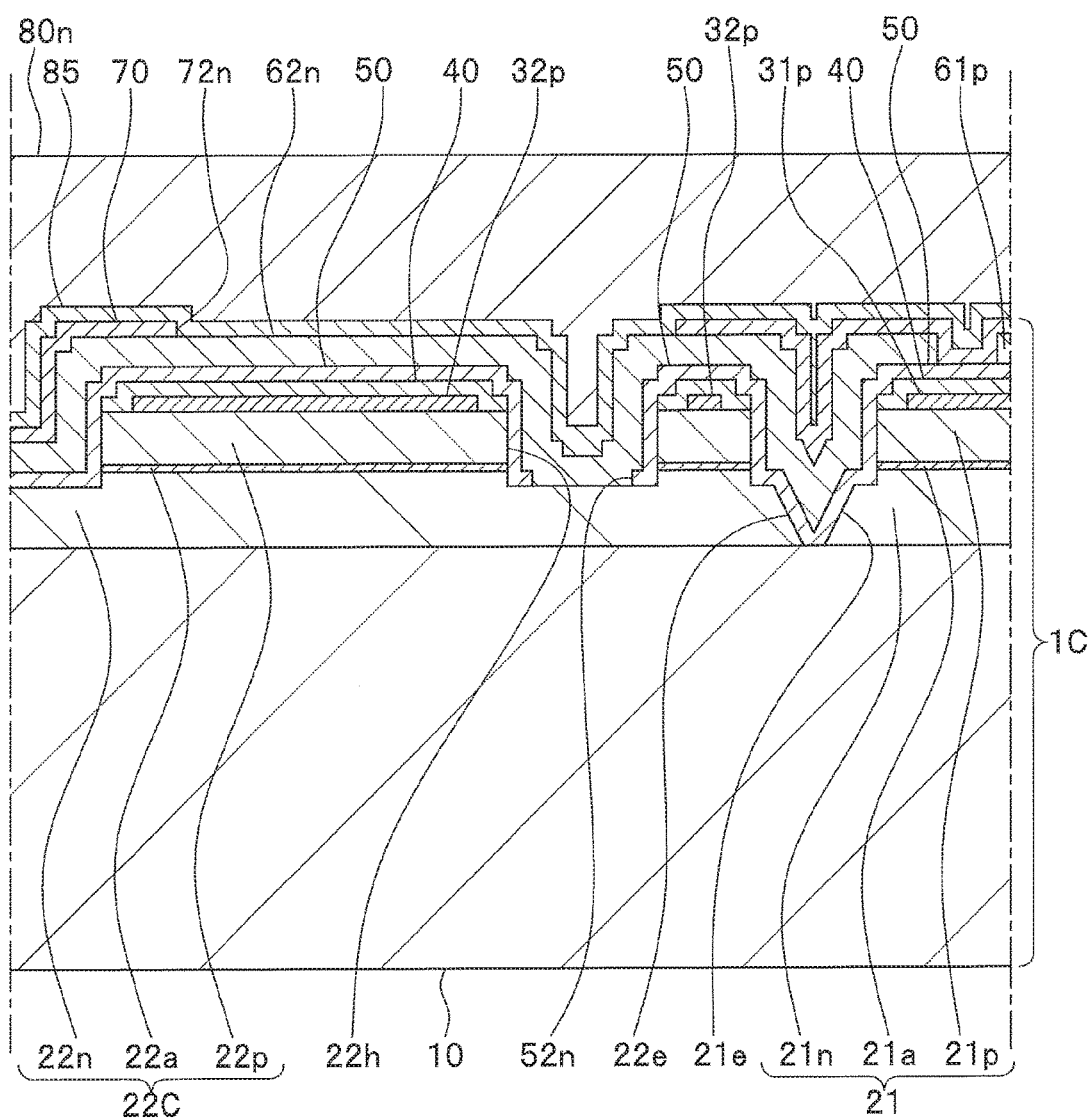
FIG. 16 is a cross-sectional view taken along line XVI-XVI in FIG. 15.

As shown in FIGS. 15 and 16, a light emitting element 1C and a light emitting device 100C according to a third embodiment are different from the light emitting element 1 and the light emitting device 100 according to the first embodiment in including two semiconductor stacked-layer bodies. In the following, constituent members similar to those of the light emitting device 100 are denoted by like reference characters, and the description thereof will not be repeated.

The light emitting device 100C includes the light emitting element 1C, and the external connection electrodes 8 (the n-side external connection electrode 80n, the first p-side external connection electrode 81p, and the second p-side external connection electrode 82p).

In the first embodiment, the n-type semiconductor layer is continuously formed across the first semiconductor region 21 and the second semiconductor region 22. On the other hand, in the third embodiment, the n-type semiconductor layer is separated between the first semiconductor region 21 and the second semiconductor region 22. Accordingly, the first semiconductor region 21 is also referred to as the first semiconductor stacked-layer body 21. Further, the second semiconductor region 22 is also referred to as the second semiconductor stacked-layer body 22C.

As shown on the right side in FIG. 16, the first semiconductor stacked-layer body 21 includes the first n-type semiconductor layer 21n, the first active layer 21a, and the first p-type semiconductor layer 21p, which are provided on the light-transmissive substrate 10.

As shown on the left side in FIG. 16, the second semiconductor stacked-layer body 22C includes a second n-type semiconductor layer 22n, the second active layer 22a, and the second p-type semiconductor layer 22p, which are provided on the light-transmissive substrate 10.

As shown in FIG. 16, in the light emitting element 1C, between the first semiconductor stacked-layer body 21 (the first light emitting portion) and the second semiconductor stacked-layer body 22C (the second light emitting portion), the p-type semiconductor layer, the active layer, and the n-type semiconductor layer are removed above the light-transmissive substrate 10. On the light-transmissive substrate 10 where these semiconductor layers are removed, the interlayer insulating film 50 and the like are stacked.

Thus, the light emitting device 100C can supply current to each of the first semiconductor stacked-layer body 21 (the first light emitting portion) above the first n-type semiconductor layer 21n where the first p-type semiconductor layer 21p is stacked, and the second semiconductor stacked-layer body 22C (the second light emitting portion) provided around the first light emitting portion and located above the second n-type semiconductor layer 22n where the second p-type semiconductor layer 22p is stacked, via the external connection electrodes 8. Accordingly, the first light emitting portion and the second light emitting portion can be controlled independently of each other.

Further, in the light emitting device 100C, since the first semiconductor stacked-layer body 21 and the second semiconductor stacked-layer body 22C are separated from each other on the light-transmissive substrate 10, the light laterally propagating in the n-type semiconductor layers 21n and 22n can be reflected at the separation end surfaces 21e and 22e (see FIG. 16). Thus, in the case where the first fluorescent material layer 91 and the second fluorescent material layer 92 are provided on the light extraction surface side (on the lower side in FIG. 16) of the light emitting element 1C, it becomes possible to more selectively cause the first fluorescent material layer 91 and the second fluorescent material layer 92 to emit light.

Fourth Embodiment

Figure 17:
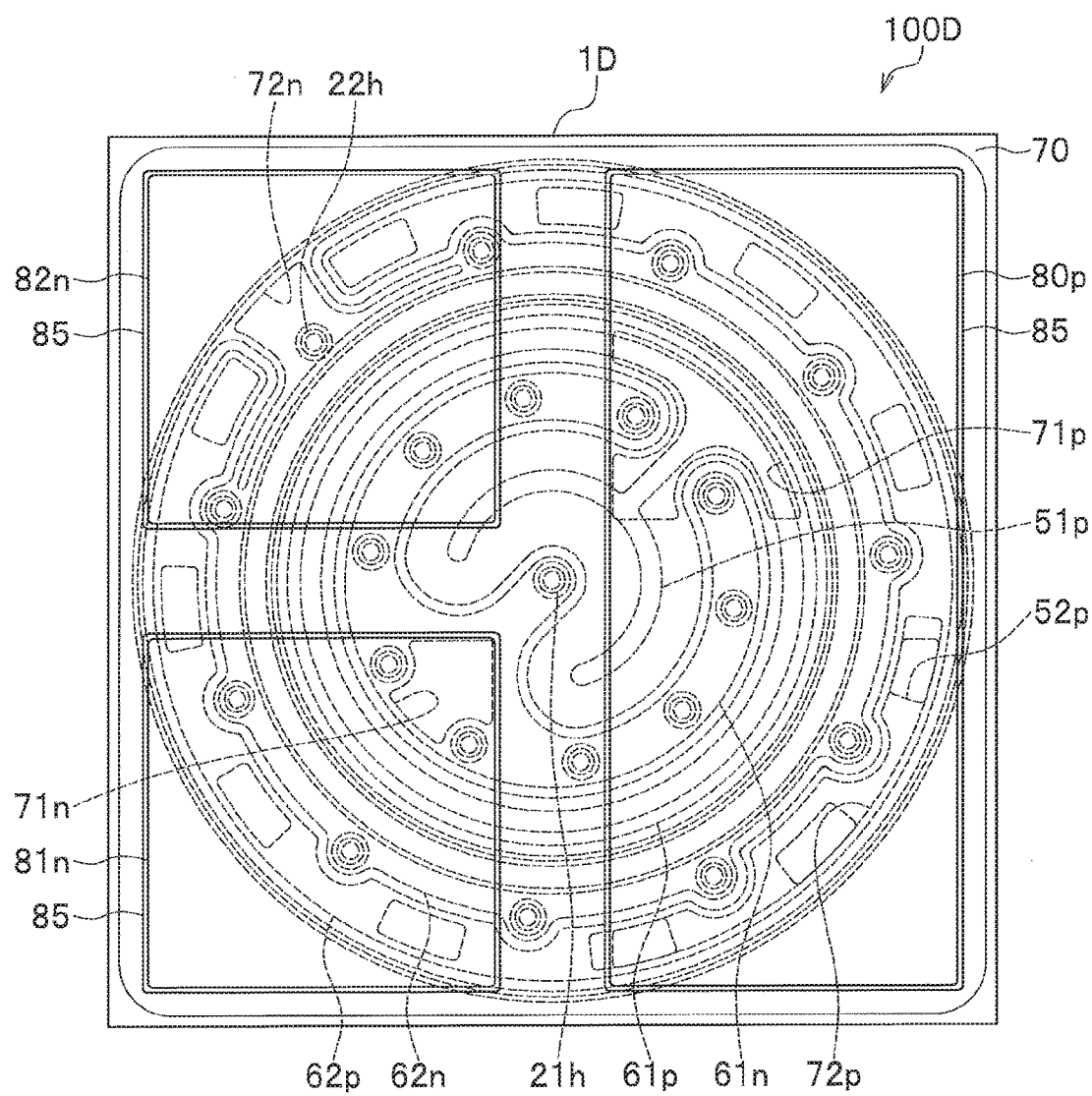
FIG. 17 is a bottom view schematically showing a light emitting device according to a fourth embodiment.

As shown in FIG. 17, a light emitting device 100D according to a fourth embodiment is different from the light emitting device 100 according to the first embodiment in the structure of the external connection electrodes 8. In the following, the constituent members similar to those of the light emitting device 100 are denoted by like reference characters, and the description thereof will not be repeated.

The light emitting device 100D includes a light emitting element 1D, and as the external connection electrodes 8 provided at the light emitting element 1D, includes a first n-side external connection electrode 81n, a second n-side external connection electrode 82n, and a p-side external connection electrode 80p.

While the light emitting element 1D includes constituent members similar to those of the light emitting element 1, they may be different from each other, for example, in the position of the through holes of the p-type semiconductor layers and that of the through holes of the insulating film. For example, in the insulating protective film 70, the shape, size, and disposition of the p-side opening 71p and the n-side opening 71n are different from the light emitting element 1 according to the first embodiment. In particular, the n-side opening 71n of the insulating protective film 70 is provided at the area where the first n-side external connection electrode 81n is disposed, and at the position avoiding the first holes 21h above the first semiconductor region 21. Note that, the shape, size, and disposition of the n-side opening 71n are not limited to those shown in FIG. 17. The light emitting element 1D structured as described above can also reduce unevenness in the current than the conventional light emitting element.

Disposition of the external connection electrodes 8 of the light emitting device 100D is identical to that of the external connection electrodes 8 of the light emitting device 100 being rotated by 180 degrees in a plan view. That is, as shown in FIG. 17, the first n-side external connection electrode 81n is provided on one side (lower left in FIG. 17) of the quadrangular light emitting element 1 in a plan view. Further, the second n-side external connection electrode 82n also is provided on the one side (upper left in FIG. 17). On the other hand, the p-side external connection electrode 80p is provided on other side opposing to the one side (right in FIG. 17).

The first n-side external connection electrode 81n is connected to the first n-side electrode 61n through the n-side opening 71n of the insulating protective film 70.

The second n-side external connection electrode 82n is connected to the second n-side electrode 62n through the n-side opening 72n of the insulating protective film 70.

The light emitting device 100D structured as described above can also improve the light emission intensity distribution through use of the light emitting element 1D.

Fifth Embodiment

Figure 18:
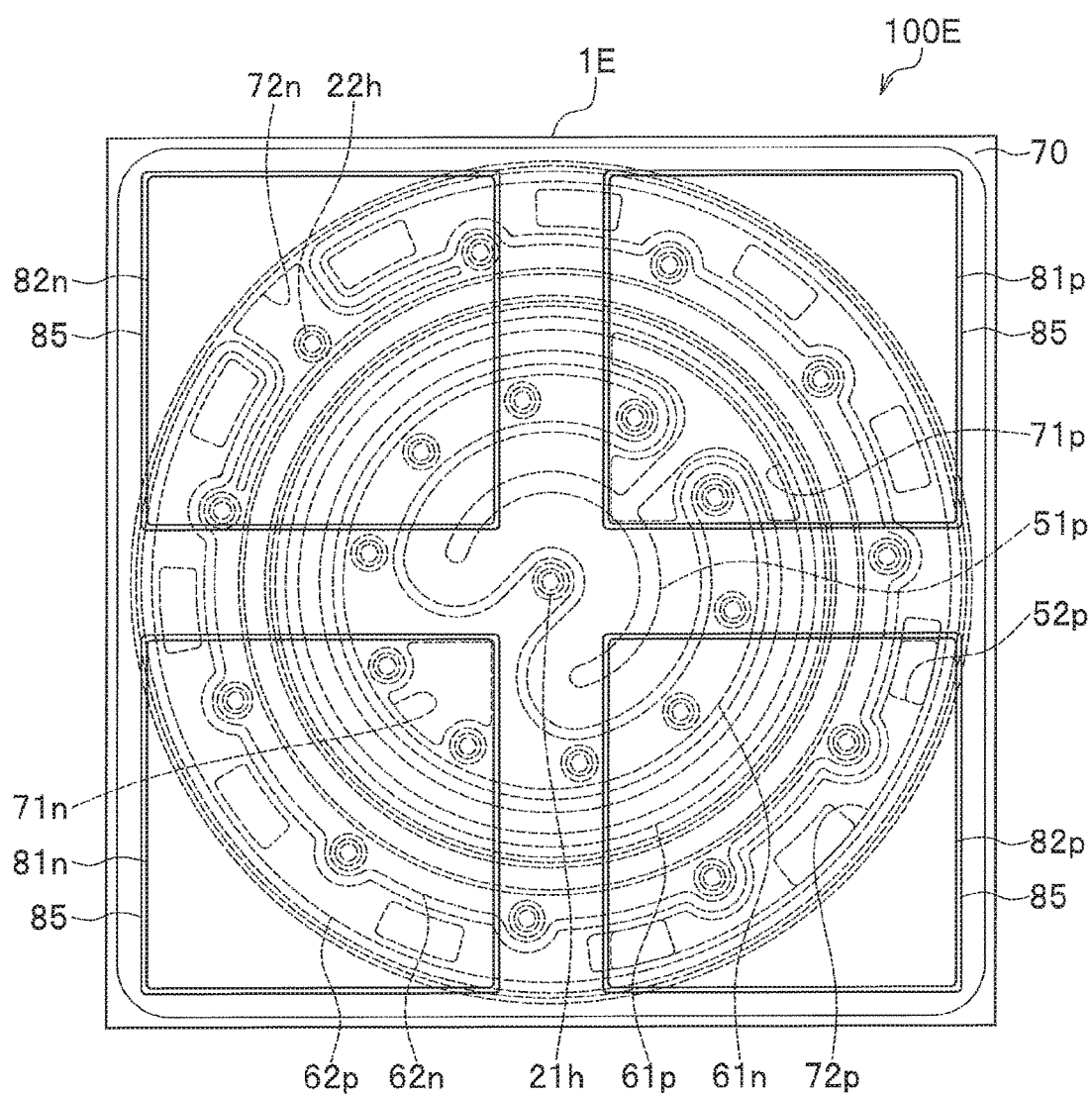
FIG. 18 is a bottom view schematically showing a light emitting device according to a fifth embodiment.

As shown in FIG. 18, a light emitting device 100E according to a fifth embodiment is different from the light emitting device 100D according to the fourth embodiment in the structure of the external connection electrodes 8. In the following, the constituent members similar to those of the light emitting device 100D are denoted by like reference characters, and the description thereof will not be repeated.

The light emitting device 100E includes a light emitting element 1E, and as the external connection electrodes 8 provided at the light emitting element 1E, includes the first n-side external connection electrode 81n, the second n-side external connection electrode 82n, the first p-side external connection electrode 81p, and the second p-side external connection electrode 82p.

Note that, the light emitting element 1E is identical to the light emitting element 1D shown in FIG. 17.

The first p-side external connection electrode 81p is connected to the first p-side electrically conductive layer 61p through the p-side opening 71p of the insulating protective film 70. That is, the first p-side external connection electrode 81p is connected to the first p-side electrode (the first p-side light reflecting layer 31p) via the first p-side electrically conductive layer 61p.

The second p-side external connection electrode 82p is connected to the second p-side electrically conductive layer 62p through the p-side opening 72p of the insulating protective film 70. That is, the second p-side external connection electrode 82p is connected to the second p-side electrode (the second p-side light reflecting layer 32p) via the second p-side electrically conductive layer 62p.

Such a four-terminal type light emitting device 100E can also improve the light emission intensity distribution through use of the light emitting element 1E.

In the foregoing, several embodiments of the present invention have been exemplary shown. However, it goes without saying that the present invention is not limited to the above-described embodiments, and can be in any mode without departing from the spirit of the present invention.

For example, the light emitting device may include the wavelength conversion member 9, and may further include the Fresnel lens 6.

The shape of the upper surface of the wavelength conversion member 9 is not limited to quadrangular, and it may be circular, elliptic, or rounded quadrangular. The shape of the upper surface of the wavelength conversion member 9 can be changed as appropriate, taking into consideration of the combination of a secondary optical system with the employed lens or the like. The light output surface of the wavelength conversion member 9 is not limited to be flat, and it may be a concave surface or a convex surface. The light output surface of the wavelength conversion member 9 may be uneven.

For example, the light emitting device 100 may have a structure in which, at the outer edge portion 22s of the semiconductor stacked-layer body 20 in a plan view, the p-type semiconductor layer, the active layer and the n-type semiconductor layer are removed above the light-transmissive substrate 10. In this case, the light emitting device has the structure in which, at the outer circumference of the second semiconductor region 22, the interlayer insulating film 50 and others are stacked on the light-transmissive substrate 10 without having the semiconductor layers interposed. Therefore, the thickness of the outer circumferential portion of the light emitting device reduces. In the case where a light emitting device including the wavelength conversion member 9 is manufactured using this light emitting device, in Step 209 where the light emitting device bonded to the composite sheet is covered by the resin containing the light reflecting substance, the reduced thickness of the outer circumferential portion of the light emitting device (the region indicated by reference character 302 in FIG. 3) advantageously facilitates distribution of the resin containing the light reflecting substance (the material of the light reflecting member 7b). The light emitting devices 100B, 100D, and 100E can be similarly modified.

Similarly, the light emitting device 100C may have a structure in which, at the outer edge portion 22s of the second semiconductor stacked-layer body 22C, the p-type semiconductor layer, the active layer, and the n-type semiconductor layer are removed above the light-transmissive substrate 10.

The light emitting devices 100C, 100D, and 100E can be modified to include the n-side openings 53n of the interlayer insulating film 50 shown in FIG. 13.

For example, the external connection electrodes 8 of the light emitting device 100 may have a stacked-layer structure composed of a plurality of types of metals. In particular, the upper surface of each of the external connection electrodes 8 serves as the mounting surface. Accordingly, at least the uppermost layer is preferably composed of Au, in order to prevent corrosion and to improve bondability with the mounting substrate using an Au-alloy-based bonding member such as Au—Sn eutectic solder. Further, in the case where the lower layer portion of each of the external connection electrodes 8 is composed of metal other than Au, such as Cu, the upper layer portion may have a stacked-layer structure such as Ni/Au or Ni/Pd/Au, in order to improve adhesion with Au. Further, the upper surface of each of the external connection electrodes 8 may be uneven.

What is claimed is:

1. A light emitting element comprising:
   a light-transmissive substrate;
   a first semiconductor stacked-layer body having a first n-type semiconductor layer provided above part of the light-transmissive substrate, and a first p-type semiconductor layer provided above the first n-type semiconductor layer, the first p-type semiconductor layer being provided with a first hole in which the first n-type semiconductor layer is exposed from the first p-type semiconductor layer;
   a first p-side electrode provided on the first p-type semiconductor layer;
   a first n-side electrode having a portion above the first p-side electrode, extending into the first hole, and being directly connected to the first n-type semiconductor layer via the first hole;
   a second semiconductor stacked-layer body having a second n-type semiconductor layer provided above the light-transmissive substrate and surrounding the first semiconductor stacked-layer body in a plan view, and a second p-type semiconductor layer provided above the second n-type semiconductor layer, the second p-type semiconductor layer being provided with a second hole in which the second n-type semiconductor layer is exposed from the second p-type semiconductor layer;
   a second p-side electrode provided on the second p-type semiconductor layer; and
   a second n-side electrode having a portion above the second p-side electrode, extending into the second hole, and being directly connected to the second n-type semiconductor layer via the second hole.

2. The light emitting element according to claim 1, wherein
   an outer edge portion of the second n-type semiconductor layer is positioned outer than the second p-type semiconductor layer in a plan view, and
   the second n-side electrode extends from above an outer edge portion of the second p-type semiconductor layer onto the outer edge portion of the second n-type semiconductor layer.

3. The light emitting element according to claim 2, wherein part of the second n-side electrode extending on the outer edge portion of the second n-type semiconductor layer is connected to the outer edge portion of the second n-type semiconductor layer along the second p-type semiconductor layer in a plan view.

4. The light emitting element according to claim 2, wherein the second n-side electrode includes at least one type selected from Ag, Al, Pt, and Rh.

5. The light emitting element according to claim 1, wherein a plurality of the first holes are arranged along an outer edge portion of the first p-type semiconductor layer.

6. The light emitting element according to claim 5, wherein the first n-side electrode extends along the arranged first holes and integrally connects the first holes.

7. The light emitting element according to claim 1, wherein a plurality of the second holes are arranged along an inner edge portion of the second p-type semiconductor layer.

8. The light emitting element according to claim 7, wherein the second n-side electrode extends along the arranged second holes and integrally connects the second holes.

9. A light emitting device comprising:
   the light emitting element according to claim 1; and
   an external connection electrode provided at the light emitting element on a side opposite to the light-transmissive substrate, wherein the external connection electrode includes:
   an n-side external connection electrode connected to the first n-side electrode and the second n-side electrode;
   a first p-side external connection electrode connected to the first p-side electrode; and
   a second p-side external connection electrode connected to the second p-side electrode.

10. The light emitting device according to claim 9, wherein
    the first p-side electrode of the light emitting element includes:
    a first p-side light reflecting layer connected to substantially an entire upper surface of the first p-type semiconductor layer; and
    a first p-side electrically conductive layer provided on the first p-side light reflecting layer and connected to the first p-side external connection electrode.

11. The light emitting device according to claim 10, wherein the first p-side light reflecting layer contains at least one type selected from Ag, Al, Pt, Rh, and Ir.

12. The light emitting device according to claim 9, wherein
    the second p-side electrode of the light emitting element includes:
    a second p-side light reflecting layer connected to substantially an entire upper surface of the second p-type semiconductor layer; and
    a second p-side electrically conductive layer provided on the second p-side light reflecting layer and connected to the second p-side external connection electrode.

13. The light emitting device according to claim 12, wherein the second p-side light reflecting layer contains at least one type selected from Ag, Al, Pt, Rh, and Ir.

14. The light emitting device according to claim 9, wherein the first p-type semiconductor layer of the light emitting element has a circular outer edge in a plan view.

15. The light emitting device according to claim 9, wherein the second p-type semiconductor layer of the light emitting element has a circular outer edge in a plan view.

16. The light emitting device according to claim 9, further comprising
    a wavelength conversion member opposing to the light-transmissive substrate of the light emitting element, wherein
    the wavelength conversion member includes, in a plan view,
    a first fluorescent material layer covering the first p-type semiconductor layer; and
    a second fluorescent material layer provided around the first fluorescent material layer and covers the second p-type semiconductor layer.

17. The light emitting device according to claim 16, wherein a wavelength of light of the light emitting element having converted by the second fluorescent material layer is longer than a wavelength of light of the light emitting element having converted by the first fluorescent material layer.

18. The light emitting device according to claim 16, further comprising a Fresnel lens provided on a side opposite to the light-transmissive substrate with reference to the wavelength conversion member.

19. A light emitting device comprising:
the light emitting element according to claim 1; and
an external connection electrode provided at the light emitting element on a side opposite to the light-transmissive substrate, wherein
the external connection electrode includes:
a first n-side external connection electrode connected to the first n-side electrode;
a second n-side external connection electrode connected to the second n-side electrode; and
a p-side external connection electrode connected to the first p-side electrode and the second p-side electrode.

20. A light emitting device comprising:
the light emitting element according to claim 1; and
an external connection electrode provided at the light emitting element on a side opposite to the light-transmissive substrate, wherein
the external connection electrode includes:
a first n-side external connection electrode connected to the first n-side electrode;
a second n-side external connection electrode connected to the second n-side electrode;
a first p-side external connection electrode connected to the first p-side electrode; and
a second p-side external connection electrode connected to the second p-side electrode.

21. A light emitting element comprising:
a light-transmissive substrate;
an n-type semiconductor layer provided above the light-transmissive substrate;
a first p-type semiconductor layer provided above part of the n-type semiconductor layer and having a first hole in which the n-type semiconductor layer is exposed from the first p-type semiconductor layer;
a first p-side electrode provided on the first p-type semiconductor layer;
a first n-side electrode having a portion above the first p-side electrode, extending into the first hole, and being directly connected to the n-type semiconductor layer via the first hole;
a second p-type semiconductor layer provided above the n-type semiconductor layer and surrounding the first p-type semiconductor layer in a plan view, the second p-type semiconductor layer having a second hole in which the n-type semiconductor layer is exposed from the second p-type semiconductor layer;
a second p-side electrode provided on the second p-type semiconductor layer; and
a second n-side electrode having a portion above the second p-side electrode, extending into the second hole, and being directly connected to the n-type semiconductor layer via the second hole.

22. The light emitting element according to claim 21, wherein
an outer edge portion of the n-type semiconductor layer is positioned outer than the second p-type semiconductor layer in a plan view, and
the second n-side electrode extends from above an outer edge portion of the second p-type semiconductor layer onto the outer edge portion of the n-type semiconductor layer.

23. The light emitting element according to claim 22, wherein part of the second n-side electrode extending on the outer edge portion of the n-type semiconductor layer is connected to the outer edge portion of the n-type semiconductor layer along the second p-type semiconductor layer in a plan view.

* * * * *